US009076959B2

(12) United States Patent
Murase et al.

(10) Patent No.: US 9,076,959 B2
(45) Date of Patent: Jul. 7, 2015

(54) MANUFACTURING METHOD OF NONVOLATILE MEMORY DEVICE AND NONVOLATILE MEMORY DEVICE

(71) Applicant: PANASONIC CORPORATION, Osaka (JP)

(72) Inventors: Hideaki Murase, Osaka (JP); Satoru Ito, Hyogo (JP); Yoshio Kawashima, Osaka (JP); Takumi Mikawa, Shiga (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 14/139,618

(22) Filed: Dec. 23, 2013

(65) Prior Publication Data

US 2014/0175369 A1 Jun. 26, 2014

(30) Foreign Application Priority Data

Dec. 26, 2012 (JP) ................................. 2012-282676

(51) Int. Cl.
*H01L 45/00* (2006.01)
*H01L 27/24* (2006.01)

(52) U.S. Cl.
CPC ............ *H01L 45/08* (2013.01); *H01L 45/1233* (2013.01); *H01L 45/146* (2013.01); *H01L 45/1675* (2013.01); *H01L 27/2463* (2013.01)

(58) Field of Classification Search
CPC .................................................... H01L 27/10
USPC .................. 257/4; 438/42, 39, 696, 699, 703
See application file for complete search history.

(56) References Cited

U.S. PATENT DOCUMENTS

| 6,571,384 | B2 * | 5/2003 | Shin et al. ...................... 438/703 |
| 7,417,271 | B2 * | 8/2008 | Genrikh et al. ................ 257/289 |
| 7,718,546 | B2 * | 5/2010 | Radigan et al. ................ 438/758 |
| 7,846,756 | B2 * | 12/2010 | Yen et al. .......................... 438/42 |
| 7,994,068 | B2 * | 8/2011 | Radigan et al. ................ 438/758 |
| 2005/0056615 | A1 * | 3/2005 | Moll et al. ........................ 216/67 |
| 2009/0283736 | A1 * | 11/2009 | Kanzawa et al. .................. 257/2 |
| 2010/0190313 | A1 * | 7/2010 | Kawashima et al. .......... 438/385 |
| 2011/0092030 | A1 * | 4/2011 | Or-Bach et al. ................ 438/129 |
| 2011/0294259 | A1 * | 12/2011 | Kanzawa et al. .............. 438/104 |
| 2013/0092893 | A1 * | 4/2013 | Kawashima et al. .............. 257/2 |
| 2013/0157437 | A1 * | 6/2013 | Yanai et al. .................... 438/424 |

FOREIGN PATENT DOCUMENTS

WO 2012/001978 A1 1/2012

* cited by examiner

*Primary Examiner* — Yu-Hsi D Sun
*Assistant Examiner* — Chi-Hua Yang
(74) *Attorney, Agent, or Firm* — McDermott Will & Emery LLP

(57) ABSTRACT

A method of manufacturing a non-volatile memory device comprises: forming a first electrode layer; a variable resistance material layer, a second electrode layer; and a hard mask layer, forming a first resist mask extending in a first direction on the hard mask layer; forming a first hard mask extending in the first direction by etching the hard mask layer using the first resist mask; forming a second resist mask extending in a second direction, on the first hard mask such that the width of the second resist mask is greater than the width of the first resist mask; forming a second hard mask by etching the first hard mask using the second resist mask; and forming a variable resistance element by patterning, by etching the second electrode layer, the variable resistance material layer and the first electrode layer using the second hard mask.

13 Claims, 12 Drawing Sheets

198.6 nm

Stripping of pattern 94.6 nm

MANUFACTURING METHOD OF NONVOLATILE MEMORY DEVICE AND NONVOLATILE MEMORY DEVICE

CROSS-REFERENCE TO RELATED PATENT APPLICATION

The application claims priority to Japanese Patent Application No. 2012-282676 filed on Dec. 26, 2012, the entire disclosure of which is incorporated herein by reference.

BACKGROUND OF THE DISCLOSURE

1. Field of the Disclosure

The present disclosure relates to a variable resistance non-volatile memory device including a variable resistance element which reversibly changes its resistance value by application of electric pulses, and a manufacturing method thereof.

2. Description of the Related Art

In recent years, with progresses of digital technologies, electronic devices such as portable information devices and information home electric appliances have been developed to provide higher functionalities. With achievement of the higher functionalities of these electronic devices, semiconductor elements incorporated into these electronic devices are developed to provide further miniaturization and a higher speed. Among them, as a non-volatile device in next generation which has a potential of replacing a flash memory, a resistive random access memory (ReRAM) including the variable resistance element has been studied and developed.

The variable resistance element refers to an element having a characteristic in which it reversibly changes its resistance state (resistance value) in response to an electric signal, and retains the changed resistance state. By allocating information to resistance states of the variable resistance element, the information can be stored in a non-volatile manner. Specifically, for example, by allocating "0" to one of a low-resistance state corresponding to a relatively smaller resistance value and a high-resistance state corresponding to a resistance value which is greater than that corresponding to the low-resistance state, and "1" to the other, binary information can be stored.

The variable resistance element includes, for example, a first electrode, a second electrode, and a variable resistance layer which is disposed between the first electrode and the second electrode and includes two metal oxide layers which are different in degree of oxygen deficiency and are stacked together. By applying an electric pulse (e.g., voltage pulse) between the first electrode and the second electrode of the variable resistance element, the resistance state of the variable resistance layer is changed from the high-resistance state to the low-resistance state or from the low-resistance state to the high-resistance state. In this variable resistance memory, it is desired that the low-resistance state and the high-resistance state corresponding to the binary information can be clearly distinguished from each other, and switching between the low-resistance state and the high-resistance state can take place stably and at a high speed.

Under the circumstances in which there are such demands, a configuration for attaining high-speed and stable switching between the low-resistance state and the high-resistance state, by suppressing non-uniformity of resistance values of variable resistance elements, has been proposed (see International Publication No. 2012/001978).

International Publication No. 2012/001978 discloses that a stacked-layer structure including a first electrode layer, a variable resistance material layer and a second electrode layer is formed, then a hard mask is formed using a photoresist mask having a shape (dot shape) in which corner portions in a planar shape are receded toward a center portion, and then the stacked-layer structure is etched using the hard mask, thereby forming the variable resistance element. The variable resistance element fabricated in this method is allowed to have round portions without corner portions having an angle of 90 degrees (variable resistance elements of dot shape are formed). According to International Publication No. 2012/001978, this method is said to be able to lessen non-uniformity of etched amounts of variable resistance material layers.

SUMMARY OF THE DISCLOSURE

However, the conventional manufacturing method of the non-volatile memory device has a problem that it is more likely that a mask pattern is stripped more easily with miniaturization of the variable resistance element, and as a result, it is difficult to form the variable resistance element.

One non-limiting and exemplary embodiment provides a variable resistance non-volatile memory device and a manufacturing method thereof, which can easily implement miniaturization while suppressing stripping of a mask pattern.

In one general aspect, the technique disclosed here is a method of manufacturing a non-volatile memory device comprising the steps: forming a first electrode layer; forming a variable resistance material layer comprising an oxygen-deficient metal oxide on the first electrode layer; forming a second electrode layer on the variable resistance material layer; forming a hard mask layer on the second electrode layer; forming a first resist mask extending in a first direction on the hard mask layer; forming a first hard mask extending in the first direction by etching the hard mask layer using the first resist mask; forming a second resist mask extending in a second direction crossing the first direction, on the first hard mask; forming a second hard mask by etching the first hard mask using the second resist mask; and forming a variable resistance element by patterning, by etching the second electrode layer, the variable resistance material layer and the first electrode layer using the second hard mask such that the variable resistance element includes a second electrode, a variable resistance layer and a first electrode; wherein a width of the second resist mask is greater than a width of the first resist mask.

The above aspect can also be implemented as a device.

The benefits and/or advantages may be individually provided by the various embodiments and features of the specification and drawings disclosure, and need not all be provided in order to obtain one or more of the same.

In accordance with the non-volatile memory device and manufacturing method of the present disclosure, stripping of the mask pattern can be suppressed and miniaturization can be implemented easily.

DETAILED DESCRIPTION OF THE EMBODIMENTS

<Background of One Aspect of the Present Disclosure>

Figure 11A:
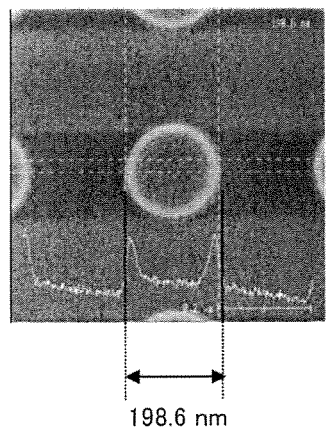
FIG. 11A is a view showing a SEM image in a case where the conventional resist mask of dot shape is formed.
Figure 11B:
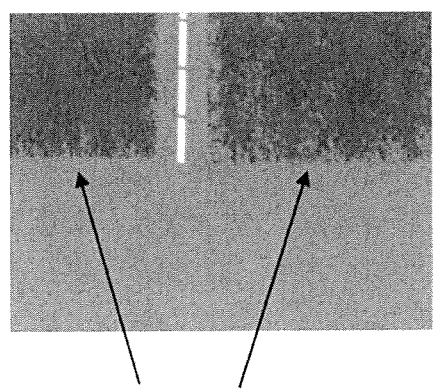
FIG. 11B is a view showing a SEM image in a case where the conventional resist mask of dot shape is formed.
Figure 11C:
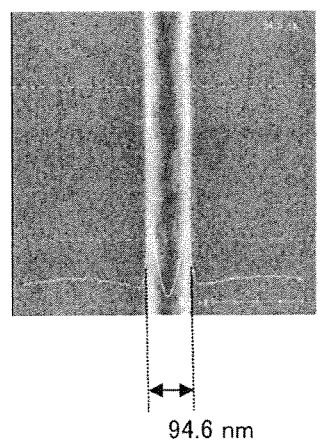
FIG. 11C is a view showing a SEM image of a resist mask of line shape used in the non-volatile memory device according to the embodiment of the present disclosure.

FIGS. 11A and 11B are views each showing a SEM image in a case where the conventional resist mask of dot shape is formed. FIG. 11C is a view showing a SEM image of a resist mask of line shape used in the non-volatile memory device according to the embodiment of the present disclosure. As shown in FIG. 11A, in a case where a resist mask of dot shape disclosed in International Publication No. 2012/001978 was formed by setting a resist mask width (design value) to about 200 nm, the resist mask of a substantially circular shape without linear portions when viewed from above was formed. However, in a case where the resist mask of dot shape disclosed in International Publication No. 2012/001978 was formed by setting the width (design value) of the resist mask to about 180 nm to provide a further miniaturized structure, pattern stripping occurred as shown in FIG. 11B. Thus, it was revealed that in the conventional manufacturing method of the variable resistance element using the resist mask of dot shape, an area (application area of resist mask) of the resist mask and a layer on which the resist mask was formed, which adhered to each other, was reduced, and the resist mask was stripped during development of the resist, when the width (design value) of the resist mask was 190 nm or less.

In contrast, as shown in FIG. 11C, in the resist mask of line shape, it was found out that the resist mask could be formed properly even when the width of the resist mask was set to about 95 nm to provide a miniaturized structure. In other words, the use of the resist mask of line shape could ensure the area of the resist mask and the region on which the resist mask was formed, which adhered to each other, even when the width of the resist mask was set smaller. Therefore, the present inventors obtained a finding that the variable resistance element having sides in planar shape, corresponding to the line width of the resist mask of line shape, could be formed by using the resist mask of line-shape.

As described above, after intensive study of the variable resistance non-volatile memory device, the present inventors obtained a first finding that the resist mask is less likely to be stripped in a more miniaturized region as compared to the resist mask of dot shape, by using the resist mask of two-line shape including the first resist mask extending in the first direction and the second resist mask extending in the second direction crossing the first direction, which can suppress the stripping of the mask pattern used to form the variable resistance element while reducing a size of the variable resistance element when the variable resistance element is formed. More specifically, the hard mask layer is etched using the first resist mask to form a first hard mask extending in the first direction. In addition, the second resist mask extending in the second direction crossing the first direction is formed on the first hard mask, and the first hard mask is etched using the second resist mask, to form a second hard mask having a planar shape defined by the width of the first resist mask and the width of the second resist mask.

Figure 12:
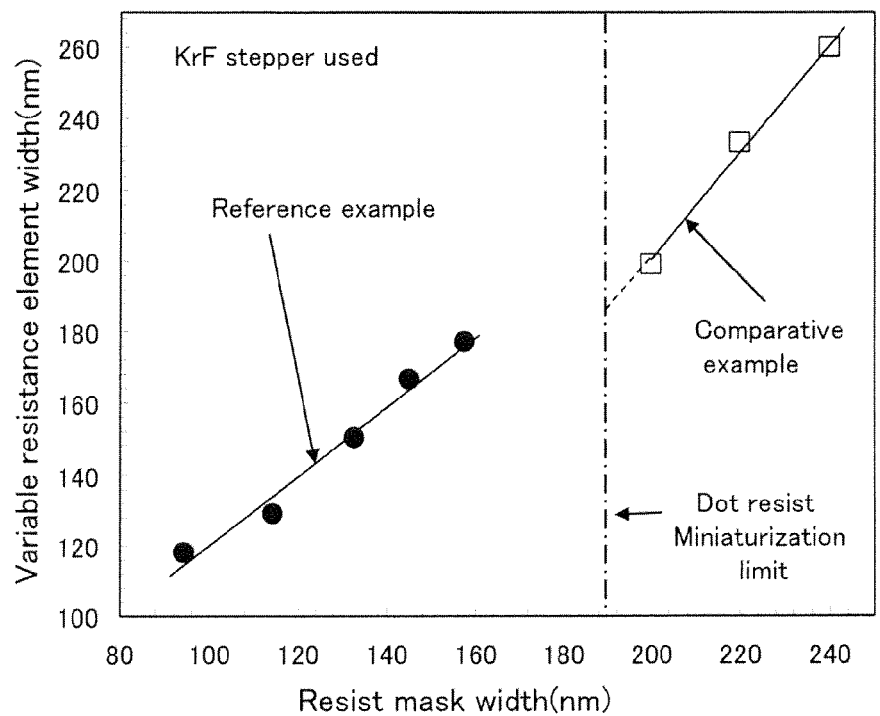
FIG. 12 is a graph showing a relationship between a width of the variable resistance element formed by patterning using a resist mask of two-line shape, and a width of the resist mask, along with Comparative example.

FIG. 12 is a graph showing a relationship between a width of the variable resistance element formed by patterning using a resist mask of two-line shape, and a width of the resist mask, along with Comparative example. Plotted resist mask widths in FIG. 12 are design dimensions. FIG. 12 is a graphical representation of measured widths of the variable resistance elements formed according to the design dimensions. Reference Example of FIG. 12 is the variable resistance elements formed using the resist mask in which the first resist mask and the second resist mask are equal to each other in line width. In FIG. 12, the values of Reference Example are indicated by round plots. As Comparative example, the variable resistance elements were formed using the resist mask of dot shape disclosed in International Publication No. 2012/001978. In FIG. 12, the values of Comparative Example are indicated by rectangular plots. In each of these examples, the resist mask was formed using the same exposure apparatus (KrF stepper).

In Comparative example, when the design dimension (width of one side) of the resist mask was 190 nm or less, the stripping of the resist mask occurred as shown in FIG. 11B, and the variable resistance element could not be formed when the design dimension was 190 nm or less (therefore, in FIG. 12, no plot exists in a range in which the design dimension was 190 nm or less). In contrast, in Reference Example in which the hard mask was formed using the resist mask of two-line shape such that the resist masks crossed each other, it was discovered that the variable resistance element could be formed in the region where one width was 190 nm or less (e.g., even in the range where the design dimension was about 100 nm). Furthermore, it was observed that the formed variable resistance element had a shape including four linear portions when viewed from above. Thus, it was proved that the variable resistance element having a shape which was substantially the same shape as a designed shape could be formed.

As described above, when the second resist mask is formed above the first hard mask extending in the first direction, which is formed using the first resist mask such that the second resist mask crosses the first hard mask, a level difference occurs between a region in which the first hard mask underlies the second resist mask and the other region. This causes a difference in distance between the second resist mask and the light source of the exposure apparatus, depending on a location. In a case where resist development is performed using the second resist mask in this state as the mask, "defocus" occurs. The "defocus" refers to a state in which there is a difference in optical axis direction between a distance (focal length) from the light source of the exposure apparatus to an imaging plane (best focus), and the distance (resist upper surface distance) from the light source to the resist mask.

When a difference amount (defocus amount) between the focal length and the resist upper surface distance increases due to the defocus, a contrast in a light intensity distribution between a portion in which the resist mask exists and a portion in which the resist mask does not exist diminishes (defocus or out of focus occurs) in the resist mask after the resist development. As a result, the width of the resist mask after development may become smaller than a designed width and may be deformed, or roughness of a side surface of the resist mask may increase. Thus, if the defocus amount increases, it is more likely that the resist mask in a proper state cannot be formed. Therefore, a hard mask in a proper state cannot be formed if the hard mask is formed by etching using such a resist mask.

The resist upper surface distance for forming the resist mask properly may fall within a specified range (depth of focus), the center of which is the focal length. In other words, even when the resist upper surface distance does not perfectly match the focal length, the resist mask of a desired shape can be formed properly so long as the defocus amount falls within the depth of focus.

After intensive study, the present inventors obtained a second finding that the depth of focus increases, i.e., allowable range (focus margin) of the defocus amount within which the resist mask in the proper state can be formed can be increased as the width (target dimension) of the resist mask of line shape increases.

Figure 13:
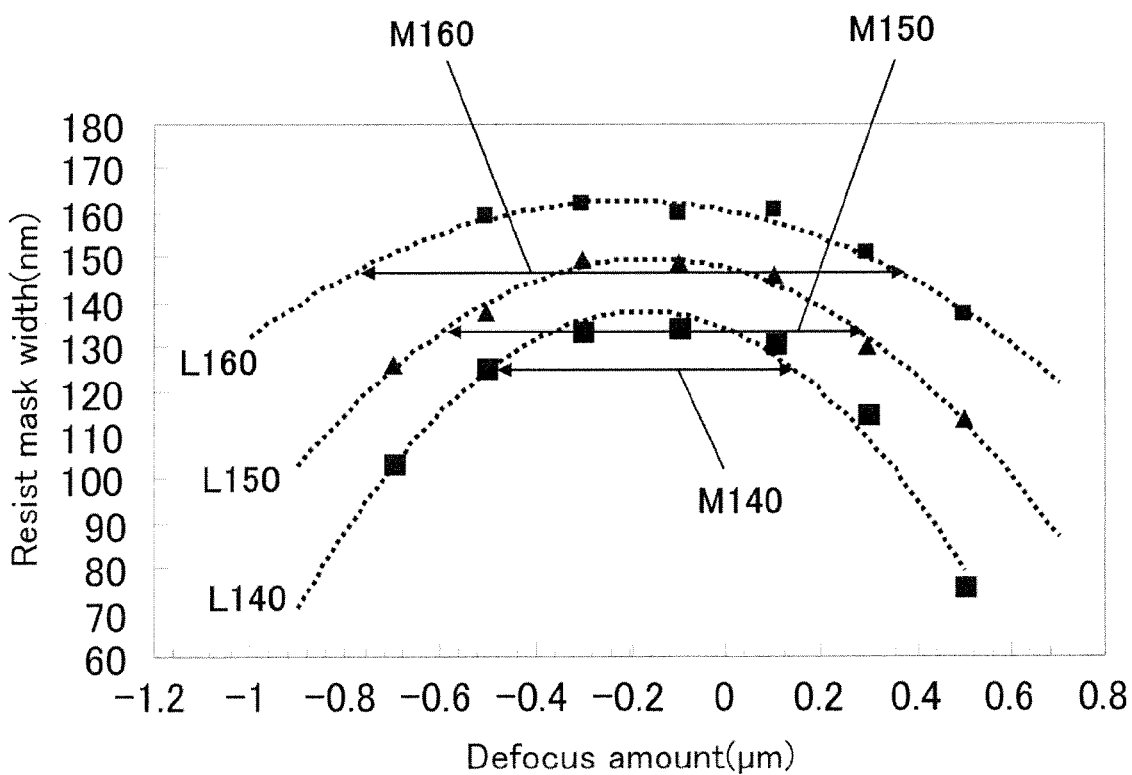
FIG. 13 is a graph showing the resist mask width in a case where resist masks are formed while changing a distance from a light source to a resist upper surface based on specified target dimensions.

FIG. 13 is a graph showing the resist mask width in a case where resist masks are formed while changing the distance from the light source to the resist upper surface based on specified target dimensions. In the example of FIG. 13, the resist masks are formed while changing the distance from the light source to the resist upper surface based on three target dimensions (design dimensions of resist mask), and the resulting resist mask widths are plotted. A horizontal axis indicates the defocus amount. An exposure amount was set constant for the resist masks. Rectangular plots indicate the resist mask widths and defocus amounts corresponding to the target dimension of 140 nm. Triangular plots indicate the resist mask widths and defocus amounts corresponding to the target dimension of 150 nm. Circular plots indicate the resist mask widths and defocus amounts corresponding to the target dimension of 160 nm. L140 indicates a predicted line formed by connecting in a parabolic shape the plots of the target dimension of 140 nm. L150 indicates a predicted line formed by connecting in a parabolic shape the plots of the target dimension of 150 nm. L160 indicates a predicted line formed by connecting in a parabolic shape the plots of the target dimension of 160 nm.

In the example of FIG. 13, each allowable range is such that the width of the resist mask formed actually is ±10% or less with respect to the target dimension, and the focus margins M140, M150, M160 are found based on the predicted lines, respectively. As can be seen from FIG. 13, as the target dimension increases, the resist forming margin increases.

As described above, from the first finding and the second finding, the present inventors conceived the manufacturing method of the non-volatile memory device and the non-volatile memory device which can suppress the stripping of the mask pattern and easily implement further miniaturization, by forming the hard mask (second hard mask as will be described later) using the resist mask of two-line shape having the first resist mask extending in the first direction and the second resist mask extending in the second direction crossing the first direction, and by setting the width of the second resist mask greater than the width of the first resist mask. In addition, in accordance with the manufacturing method of the non-volatile memory device and the non-volatile memory device, it becomes possible to lessen non-uniformity of dimensions of the formed hard masks (second hard masks). This allows the variable resistance element to be miniaturized and the non-uniformity of dimensions of the variable resistance elements to be lessened.

Moreover, after intensive study, the present inventors obtained a third finding that the pattern stripping of the second resist mask can be suppressed efficiently in a case where a ratio of the second resist mask $d2$ with respect to a height $h$ of the first hard mask is greater than 1 (i.e., $d2/h>1$).

<Outline of One Aspect of the Present Disclosure>

According to an aspect of the present disclosure, there is provided a method of manufacturing a non-volatile memory device comprising the steps: forming a first electrode layer; forming a variable resistance material layer comprising an oxygen-deficient metal oxide on the first electrode layer; forming a second electrode layer on the variable resistance material layer; forming a hard mask layer on the second electrode layer; forming a first resist mask extending in a first direction on the hard mask layer; forming a first hard mask extending in the first direction by etching the hard mask layer using the first resist mask; forming a second resist mask extending in a second direction crossing the first direction, on the first hard mask; forming a second hard mask by etching the first hard mask using the second resist mask; and forming a variable resistance element by patterning, by etching the second electrode layer, the variable resistance material layer and the first electrode layer using the second hard mask such that the variable resistance element includes a second electrode, a variable resistance layer and a first electrode; wherein a width of the second resist mask is greater than a width of the first resist mask.

In accordance with the above manufacturing method, the hard mask layer and the first resist mask extending in the first direction are formed on the stacked-layer structure including the first electrode layer, the variable resistance material layer, and the second electrode layer such that they are stacked together, and then the hard mask layer is etched using the first resist mask, to form the first hard mask extending in the first direction. Then, the second resist mask extending in the second direction crossing the first direction is formed on the first hard mask, and the first hard mask is etched using the second resist mask, to form the second hard mask having a specified width in the first direction and a specified width in the second direction. The above stated stacked-layer structure is etched using the second hard mask, thereby forming the variable resistance element.

In the above described manner, the width of the second hard mask in the first direction and the width of the second hard mask in the second direction crossing the first direction are defined by the width of the first resist mask and the width of the second resist mask, respectively. This means that if the length of the first resist mask and the length of the second resist mask are sufficiently greater relative to the width of the first resist mask and the width of the second resist mask, the length of the first resist mask and the length of the second resist mask do not affect the miniaturization of the second hard mask. Therefore, even when the width of the first resist mask and the width of the second resist mask are set smaller, it is possible to ensure a sufficient area of the hard mask and the resist mask which adhere to each other. This makes it possible to implement further miniaturization while suppressing stripping of the mask pattern.

By setting the width of the second resist mask greater than the width of the first resist mask, the focus margin can be set greater than in the case of forming the first resist mask and non-uniformity of dimensions can be suppressed, when the second resist mask is formed on the layer which has a level difference due to the first resist mask of line shape. By comparison, the first resist mask can be formed properly on the layer with no level difference even when the focus margin is set smaller. Therefore, a miniaturized structure can be implemented. As a result, it becomes possible to easily suppress non-uniformity of dimensions of the variable resistance elements while easily providing a miniaturized structure.

Furthermore, since the variable resistance element with non-uniformity of characteristics lessened can be manufactured using the existing semiconductor process steps, the manufacturing method which is easily applicable to (i.e., highly compatible with) the semiconductor process steps which are developed to attain a further miniaturized structure, can be implemented.

The width of the first resist mask and the width of the second resist mask may be 190 nm or less. By forming the first hard mask using the first resist mask of line shape extending in the first direction and forming the second hard mask using the second resist mask of line-shape extending in the second direction, an area (application area of resist mask) of the resist mask and the hard mask which adhere to each other, is increased, which makes it possible to attain a state in which the resist mask is less likely to be stripped from the hard mask. As a result, it becomes possible to form the resist mask of 190 nm or less, which was difficult to form using the resist mask of dot shape in the conventional manufacturing method.

The variable resistance element may have a shape in which the variable resistance element includes a pair of first linear portions which are opposite to each other and a pair of second linear portions extending in a direction crossing the pair of first linear portions, when viewed from above. With this configuration, it becomes possible to attain the variable resistance element which has a miniaturized pattern, a high capacity and a fixed shape. As a result, it becomes possible to implement a non-volatile memory device having a great capacity with non-uniformity of characteristics lessened.

In the step of forming the first hard mask, the hard mask layer may be etched such that the variable resistance material layer is not exposed; and in the step of forming the second hard mask, the first hard mask layer may be etched such that the variable resistance material layer is not exposed. In accordance with this method, when the first hard mask and the second hard mask are formed, the variable resistance material layer is not exposed. Therefore, it becomes possible to reduce the number of times at least the side surfaces of the variable resistance layer formed by patterning are exposed to an etching plasma and an etching gas and time for which at least the side surfaces of the variable resistance layer is exposed to the etching plasma and the etching gas, as compared to the conventional manufacturing method. Therefore, etching damages to the variable resistance layer can be lessened, and non-uniformity of characteristics of the variable resistance elements can be lessened.

In the step of forming the variable resistance element by patterning, at least side surfaces of the variable resistance layer may be formed together. With this method, the side surfaces of the variable resistance layer formed by patterning are exposed to the etching gas once. This can mitigate etching damages to the variable resistance layer, and hence lessen non-uniformity of characteristics of the variable resistance elements. The phrase "the side surfaces of the variable resistance layer are formed together" means that the side surfaces of the variable resistance layer are formed together in the same process step.

The second electrode layer may comprise a precious metal. As described above, when the first hard mask is etched, a region of an exposed upper surface exists. If the thickness of the second electrode layer decreases due to the etching, there is a possibility that there is non-uniformity of resistance changing characteristics due to non-uniformity of shapes of the variable resistance elements formed. To address this, the second electrode layer is formed as an electrode layer comprising precious metal such as iridium and platinum and having a high etching resistance. This can increase an etching selectivity of the first hard mask with respect to the second electrode layer, which can reduce a possibility that the second electrode layer is etched and suppress non-uniformity of resistance changing characteristics.

The second electrode layer may be exposed in a region other than the second hard mask layer in a state in which the second hard mask layer is formed, when viewed from above. This makes it possible to reduce a possibility that the variable resistance material layer is exposed to the etching gas and suppress non-uniformity of characteristics of the variable resistance elements.

The variable resistance material layer may comprise a transition metal oxide such as a tantalum oxide, a hafnium oxide and a zirconium oxide, or an aluminum oxide. In a case where any of these metal oxides is used as the metal oxide constituting the variable resistance material layer, a good retention characteristics can be attained, a normal resistance changing operation can occur at a high speed, and non-uniformity of characteristics of the resistance changing operation can be lessened. By using any of these metal oxides as the variable resistance material layer, an initial break voltage can be reduced and time for which the initial break voltage is applied can be reduced, even when the variable resistance element is required to go through initial breakdown.

A ratio of the width of the second resist mask with respect to a height of the first hard mask may be greater than 1. This makes it possible to efficiently suppress the pattern stripping of the second resist mask.

According to another aspect of the present disclosure, a non-volatile memory device comprises a stacked-layer structure including: a first electrode; a second electrode; and a variable resistance layer which is disposed between the first electrode and the second electrode and comprises an oxygen-deficient metal oxide which reversibly changes its resistance value in response to an electric signal applied between the first electrode and the second electrode, the first electrode, the second electrode and the variable resistance layer being stacked together; wherein the stacked-layer structure has a shape in which the stacked-layer structure includes a pair of first linear portions which are parallel to each other and a pair of second linear portions which are parallel to each other and extend in a direction crossing the pair of first linear portions, when viewed from above: wherein a distance between the pair of second linear portions is greater than a distance between the pair of first linear portions; and wherein the distance between the pair of second linear portions is 190 nm or less.

In accordance with the non-volatile memory device having the above configuration, since the distance between the pair of second linear portions is greater than the distance between the pair of first linear portions, the distance between the first linear portions can be reduced, and an area (application area of the resist mask) of the resist mask and a resist mask formation region which adhere to each other in the case where the variable resistance element 1 is formed, can be increased. This makes it difficult for the resist mask to be stripped. Because of this, at least the distance between the pair of first linear portions (length of one side the variable resistance element including the second linear portions) can be made smaller than the width (diameter) of the variable resistance element formed using the conventional resist mask of dot shape. Therefore, assuming that a space between elements is constant, miniaturization in a direction in which the pair of first linear portions are opposite to each other (length direction of the second linear portions) can be implemented.

EMBODIMENT

Hereinafter, the manufacturing method of the non-volatile memory device according to an embodiment of the present disclosure will be described with reference to the drawings. Description of the constituents designated by the same reference symbols in the drawings will be sometimes omitted. For easier understanding, in the drawings, the constituents are schematically shown, and their shapes, and the like are not sometimes accurate. Also, the number of constituents are illustrated for easier illustration. Numeric values, materials, constituents (elements), layout positions of the constituents, connection form of the constituents, steps, the order of the steps, etc., which are illustrated in the embodiments described below, are merely exemplary, and are not intended to limit the present disclosure. Also, among the constituents in the embodiments described below, the constituents which are not recited in independent claims defining a broadest concept of the present disclosure will be described as arbitrary constituents constituting a more preferable embodiment.

Figure 1A:
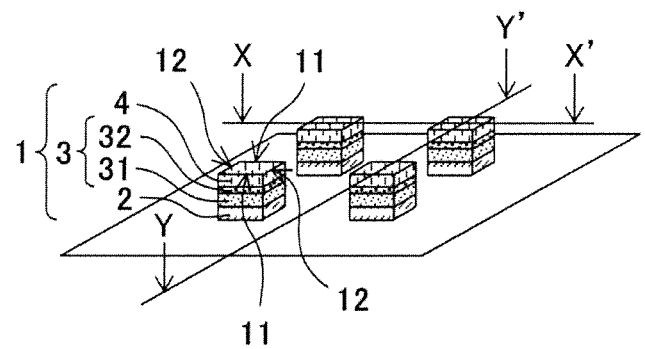
FIG. 1A is a perspective view showing an exemplary configuration of a variable resistance element in a non-volatile memory device according to an embodiment of the present disclosure.
Figure 1B:
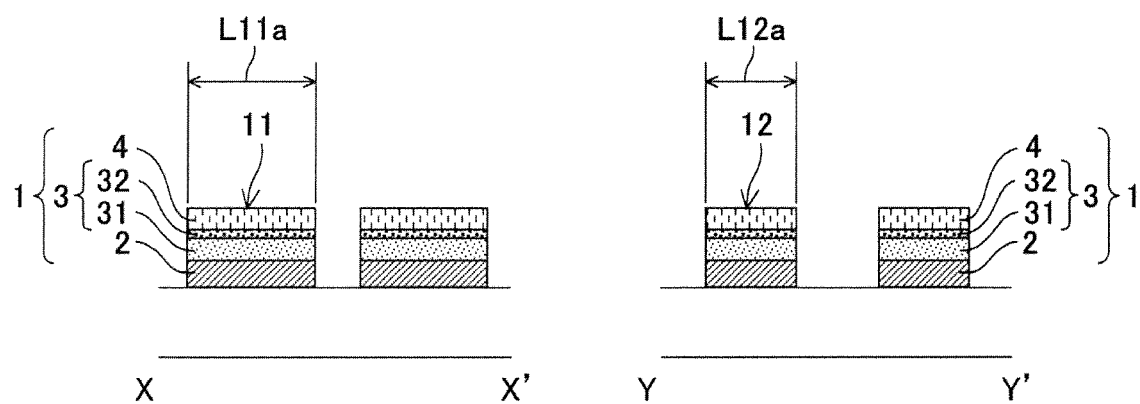
FIG. 1B is a cross-sectional view of the variable resistance element of FIG. 1A, taken along X-X' of FIG. 1A and a cross-sectional view of the variable resistance element of FIG. 1A, taken along Y-Y' of FIG. 1A.

FIG. 1A is a perspective view showing an exemplary configuration of a variable resistance element in a non-volatile memory device according to an embodiment of the present disclosure. FIG. 1B is a cross-sectional view of the variable resistance element of FIG. 1A, taken along X-X' of FIG. 1A and a cross-sectional view of the variable resistance element of FIG. 1A, taken along Y-Y' of FIG. 1A. A plurality of variable resistance elements 1 of the present embodiment may be formed on a specified interlayer insulating layer and a specified contact plug as will be described later. Each of the plurality of variable resistance elements 1 includes a first electrode 2 which is a lower electrode, a second electrode 4 which is an upper electrode, and a variable resistance layer 3 which is interposed between the first electrode 2 and the second electrode 4 and comprises an oxygen-deficient metal oxide which reversibly changes its resistance value in response to an electric signal applied between the first electrode 2 and the second electrode 4.

In the present embodiment, the variable resistance layer 3 includes the oxygen-deficient metal oxide, the resistance value of which increases with an increase in an oxygen content. This makes it possible to attain a reversible and stable rewrite characteristic and a good retention characteristic in addition to a high-speed resistance changing operation, by applying the electric signal to the variable resistance element 1. In addition, by using this variable resistance layer 3 and optimizing the oxygen content of the variable resistance layer 3 and its distribution (profile), the high-speed operation can be implemented by the electric signal having a short pulse width (e.g., 100 ns or less). Furthermore, in accordance with the variable resistance layer 3, a resistance changing magnitude can be increased (difference of 1 digit or more can be attained), and a read margin can be increased.

The phrase "the variable resistance layer 3 includes the metal oxide, the resistance value of which increases with an increase in an oxygen content" is meant to include a case where a metal oxide which increases its resistance value as the oxygen content increases is predominantly included in the material constituting the variable resistance layer 3, and may be meant to include a case where a minute amount of impurities or additives which do not affect the resistance changing operation of the variable resistance layer 3 is included in the material constituting the variable resistance layer 3. For example, to finely adjust the resistance value of the variable resistance layer 3, the variable resistance layer 3 may be adapted to intentionally comprise a minute amount of other elements. For example, if nitrogen is added to the variable resistance layer 3 comprising the metal oxide, the resistance value of the variable resistance layer 3 is increased, which can improve a reactivity of resistance changing operation.

The resistance change is implemented by a phenomenon in which oxygen ions gather due to an electric field, in a location of the variable resistance layer 3 which is in the vicinity of an interface between the variable resistance layer 3 and one of the pair of electrodes 2, 4 sandwiching the variable resistance layer 3, and the oxygen ions staying in this location are diffused therefrom. Specifically, for example, in a bipolar non-volatile memory device which is configured to apply voltages (electric pulses) which are different in polarity from each other between the pair of electrodes 2, 4, by applying to one of the electrodes, a positive voltage with respect to the other electrode, the oxygen ions negatively charged migrate to gather in the location of the variable resistance layer 3 which is in the vicinity of the interface between the variable resistance layer 3 and this electrode, so that a high-resistance layer is formed in this location. Thus, the variable resistance layer 3 is changed to the high-resistance state. Conversely, by applying to this electrode, a negative voltage with respect to the other electrode, the oxygen ions staying in the location which is in the vicinity of the interface between the variable resistance layer 3 and this electrode, are diffused therefrom to another portion of the variable resistance layer 3, so that a portion of the variable resistance layer 3 which is present in the location which is in the vicinity of the interface between the variable resistance layer 3 and this electrode is changed to the low-resistance state. The oxygen ions present in the location which is in the vicinity of the interface are diffused to another portion of the variable resistance layer 3. However, a volume of another portion of the variable resistance layer 3 is much greater than a volume of the portion of the variable resistance layer 3 in the location which is in the vicinity of the interface. For this reason, the resistance value of another portion of the variable resistance layer 3 is not significantly increased.

The variable resistance element 1 of the present embodiment is also applicable to a unipolar non-volatile memory device which is configured to apply voltages (electric pulses) with the same polarity between the pair of electrodes 3, 4 and to switch the resistance state between the high-resistance state and the low-resistance state by changing a magnitude (intensity of electric pulse) of the voltage and/or time (pulse width of electric pulse) for which the voltage is applied.

The variable resistance layer 3 includes at least a first variable resistance layer 31 connected to the first electrode 2 and a second variable resistance layer 32 connected to the second electrode 4 such that the first variable resistance layer 31 and the second variable resistance layer 32 are stacked together. The thickness of the first variable resistance layer 31 is, for example, about 10 nm or more and 100 nm or less. The thickness of the second variable resistance layer 32 is, for example, about 1 nm or more and 10 nm or less.

The first variable resistance layer 31 comprises an oxygen-deficient first metal oxide, while the second variable resistance layer 32 comprises an oxygen-deficient second metal oxide which is lower in degree of oxygen deficiency than the first metal oxide. In the second variable resistance layer 32, there is formed a minute localized region which reversibly changes degree of oxygen deficiency in response to the electric pulse applied. It is considered that the localized region contains a filament comprising oxygen-deficient sites.

It is estimated that a resistance changing phenomenon in the variable resistance layer 3 having a stacked-layer structure is such that a redox reaction takes place in the minute localized region formed within the second variable resistance layer 32 comprising the second metal oxide having a higher resistance, and the filament (conductive path) in this localized region changes, thereby causing the resistance value to change.

Specifically, when a positive voltage is applied to the second electrode 4 connected to the second variable resistance layer 32 comprising the second metal oxide, on the basis of the first electrode 2, the oxygen ions in the variable resistance layer 3 are drawn toward the second variable resistance layer 32. Thereby, an oxidation reaction proceeds in the minute localized region formed within the second variable resistance layer 32, and the degree of oxygen deficiency decreases (oxygen content increases) in this region. This may result in a situation in which connection of the filament in the localized region does not easily occur, and the resistance value increases.

Conversely, when a negative voltage is applied to the second electrode 4 connected to the second variable resistance layer 32 comprising the second metal oxide, on the basis of the first electrode 2, the oxygen ions within the second variable resistance layer 32 are forced to migrate toward the first variable resistance layer 31. Thereby, a reduction reaction proceeds in the minute localized region formed within the second variable resistance layer 32, and the degree of oxygen deficiency increases (oxygen content decreases) in this region. This may result in a situation in which connection of the filament in the localized region easily occurs, and the resistance value decreases.

The term "degree of oxygen deficiency" refers to a ratio of an amount of oxygen which is deficient, with respect to an amount of oxygen constituting an oxide having a stoichiometric composition (stoichiometric composition corresponding to a greatest resistance value in a case where there exist plural stoichiometric compositions) of each metal oxide. A metal oxide having a stoichiometric composition is more stable and has a greater resistance value than a metal oxide having another composition.

For example, in a case where a metal is tantalum (Ta), a tantalum oxide having a stoichiometric composition according to the above definition is $Ta_2O_5$, and therefore is expressed as $TaO_{2.5}$. The degree of oxygen deficiency of $TaO_{2.5}$ is 0%. The degree of oxygen deficiency of $TaO_{1.5}$, is $(2.5-1.5)/2.5=40\%$. An oxygen excess metal oxide has a negative value in degree of oxygen deficiency. In the present specification, the degree of oxygen deficiency is meant to include a positive value, 0 and a negative value unless otherwise explicitly noted.

An oxide which is lower in degree of oxygen deficiency is closer to the oxide having a stoichiometric composition and therefore has a greater resistance value, while an oxide which is higher in degree of oxygen deficiency is closer to a metal constituting the oxide and therefore has a smaller resistance value.

The term "oxygen content atomic percentage" refers to a ratio of the number of oxygen atoms to the total number of atoms. For example, the oxygen content atomic percentage of $Ta_2O_5$ is the ratio of the number of oxygen atoms to the total number of atoms (O/(Ta+O)) and is 71.4 atm %. Therefore, the oxygen content atomic percentage of the oxygen-deficient tantalum oxide is higher than 0 and lower than 71.4 atm %. For example, in a case where the metal constituting the first metal oxide and the metal constituting the second metal oxide are of the same kind, there is a correspondence between the oxygen content atomic percentage and the degree of oxygen deficiency. In this case, when the oxygen content atomic percentage of the second metal oxide is higher than the oxygen content atomic percentage of the first metal oxide, the degree of oxygen deficiency of the second metal oxide is lower than the degree of oxygen deficiency of the first metal oxide.

In the present embodiment, as an example of the variable resistance layer 3, a metal oxide of the same kind is used as the first metal oxide constituting the first variable resistance layer 31 and the second metal oxide constituting the second variable resistance layer 32. For example, each of the variable resistance layers 31, 32 includes a tantalum oxide. When a composition of a first tantalum oxide constituting the first variable resistance layer 31 is expressed as $TaO_x$, and a composition of a second tantalum oxide constituting the second variable resistance layer 32 is expressed as $TaO_y$, $0<x<2.5$, and $x<y$ are satisfied. In other words, the second tantalum oxide $TaO_y$ is set higher in oxygen content atomic percentage than the first tantalum oxide $TaO_x$. Furthermore, for example, the first tantalum oxide layer $TaO_x$ satisfies $0.8 \leq x \leq 1.9$, while the second tantalum oxide layer $TaO_y$ satisfies $2.1 \leq y \leq 2.5$.

As the metal constituting the variable resistance layer 3, a metal other than tantalum may be used. As the metal constituting the variable resistance layer 3, a transition metal, or aluminum (Al) may be used. As the transition metal, tantalum (Ta), titanium (Ti), hafnium (Hf), zirconium (Zr), niobium (Nb), tungsten (W), nickel (Ni), etc., may be used. Since the transition metal can assume plural oxidated states, different resistance states can be implemented by the redox reaction.

When a composition of the first metal oxide constituting the first variable resistance layer 31 is expressed as $HfO_x$ and a composition of the second metal oxide constituting the second variable resistance layer 32 is expressed as $HfO_y$, in a case where a hafnium oxide is used, $0<x<2.0$, and $x<y$ are satisfied. In addition, a first hafnium oxide $HfO_x$ satisfies $0.9 \le x \le 1.6$, while a second hafnium oxide $HfO_y$ satisfies $1.8<y<2.0$.

When a composition of the first metal oxide constituting the first variable resistance layer 31 is expressed as ZrO, and a composition of the second metal oxide constituting the second variable resistance layer 32 is expressed as $ZrO_y$, in a case where zirconium oxide is used, $0<x<2.0$ and $x<y$ are satisfied. In addition, a first zirconium oxide ZrO, satisfies $0.9 \le x \le 1.4$, while a second zirconium oxide $ZrO_y$ satisfies $1.9<y<2.0$.

The first metal constituting the first metal oxide and the second metal constituting the second metal oxide may be different metals. In this case, the second metal oxide may be lower in degree of oxygen deficiency than the first metal oxide. In other words, the second metal oxide may be higher in resistance than the first metal oxide. In this configuration, a larger portion of a voltage applied between the first electrode 2 and the second electrode 4 for cause the resistance change is fed to the second metal oxide. This facilitates the redox reaction taking place within the second metal oxide.

When the first metal constituting the first metal oxide included in the first variable resistance layer 31 and the second metal constituting the second metal oxide included in the second variable resistance layer 32 are different materials, the second metal may be lower in standard electrode potential than the first metal. The standard electrode potential is a characteristic in which as its value is greater, the corresponding material is less easily oxidated. Because of this, in the second metal oxide which is relatively lower in standard electrode potential, the redox reaction takes place more easily.

For example, a stable resistance changing operation is attained by using the oxygen-deficient tantalum oxide ($TaO_x$) as the first metal oxide and by using titanium oxide ($TiO_2$) as the second metal oxide. Titanium (standard electrode potential=−1.63 eV) has a lower standard electrode potential than tantalum (standard electrode potential=−0.6 eV). By using as the second metal oxide an oxide of a metal having a lower standard electrode potential than the first metal oxide as described above, the redox reaction easily takes place within the second metal oxide. Instead of the tantalum oxide, aluminum oxide ($Al_2O_3$) may be used as the second metal oxide which becomes a high-resistance layer. Or, for example, the oxygen-deficient tantalum oxide ($TaO_x$) may be used as the first metal oxide, and the aluminum oxide ($Al_2O_3$) may be used as the second metal oxide.

In accordance with the above configuration, the second electrode 4 is connected to the second variable resistance layer 32 comprising the second metal oxide which is lower in degree of oxygen deficiency. The second electrode 4 comprises a material which is higher in standard electrode potential than the metal constituting the second metal oxide and the material constituting the first electrode 2. For example, as the second electrode 4, precious metal such as platinum (Pt), iridium (Ir), or palladium (Pd), etc., is used.

The first electrode 2 connected to the first variable resistance layer 31 comprising the first metal oxide which is higher in degree of oxygen deficiency, comprises a material which is lower in standard electrode potential than the metal constituting the first metal oxide. For example, the first electrode 2 comprises tungsten (W), nickel (Ni), tantalum (Ta), titanium (Ti), aluminum (Al), tantalum nitride (TaN), titanium nitride (TiN), etc. The thickness of the first electrode 2 is set to, for example, about 20 to 100 nm.

A relationship among the standard electrode potentials of the materials will be summarized as follows. When the standard electrode potential of the second electrode 4 is $V_2$, the standard electrode potential of the metal constituting the second metal oxide is expressed as $V_{r2}$, the standard electrode potential of the metal constituting the first metal oxide is expressed as $V_{r1}$, and the standard electrode potential of the first electrode 2 is expressed as $V_1$, these materials satisfy a relationship of $V_{r2}<V_2$ and $V_1<V_2$. Alternatively, these materials may satisfy a relationship of $V_{r2}<V_2$ and $V_1 \le V_{r1}$.

The standard electrode potential refers to a characteristic in which as its value is greater, the corresponding material is less easily oxidated. Therefore, by satisfying $V_{r2}<V_2$, the redox reaction selectively takes place in a portion of the second variable resistance layer 32 which is in the vicinity of an interface between the second electrode 4 which is higher in standard electrode potential and the variable resistance layer 3 (second variable resistance layer 32), in response to the electric signal applied between the electrodes 2, 4, thereby forming the variable resistance layer with a higher oxygen concentration or a lower oxygen concentration. In addition, by satisfying $V_1<V_2$, the redox reaction in an electrode interface region takes place predominantly in a location closer to the second electrode 4. Therefore, a stable resistance changing phenomenon in the variable resistance layer 3 can be attained.

The thickness of the second electrode 4 may be set to, for example, about 30 nm. The second electrode 4 may have a single-layer structure, or a stacked-layer structure composed of a plurality of layers.

In the present embodiment, the variable resistance element 1 has a shape in which it has a pair of first linear portions 11 which are parallel to each other when viewed from above, and a pair of second linear portions 12 which are parallel to each other and extend in a direction crossing the pair of first linear portions 11, when viewed from above. The first linear portions 11 and the second linear portions 12 are connected together via curved portions 13. A distance L11a between the pair of second linear portions 12 (width of the variable resistance element 1 including the first linear portions 11) is set greater than a distance L12a between the pair of first linear portions 11 (width of the variable resistance element 1 including the second linear portions 12).

In accordance with the above described configuration, since the distance L11a between the pair of second linear portions 12 is greater than the distance L12a between the pair of first linear portions 11, the distance L11a between the first linear portions 11 can be reduced, and an area (application area of resist mask) of the resist mask and a resist mask formation region (hard mask) which adhere to each other in the case where the variable resistance element 1 is formed, can be ensured. This makes it difficult for the resist mask to be stripped. Because of this, at least the distance L12a between the pair of first linear portions 11 (length of one side of the variable resistance element 1 including the second linear portions 12) can be made smaller than the width (diameter) of the variable resistance element formed using the conventional resist mask of dot shape. Therefore, assuming that a space between elements is constant, miniaturization in a direction of the distance between the first linear portions 11 (length direction of the second linear portions 12) can be implemented.

Figure 2:
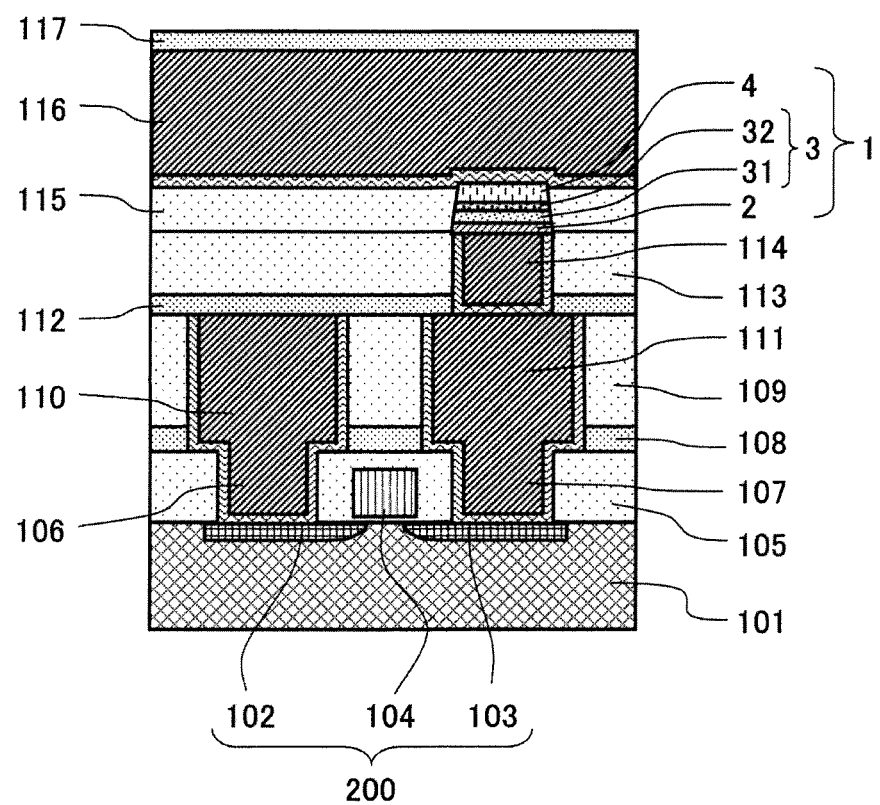
FIG. 2 is a cross-sectional view showing an exemplary configuration of the non-volatile memory device according to the embodiment of the present disclosure.

Hereinafter, an exemplary schematic configuration of the non-volatile memory device including the variable resistance element 1 of the present embodiment will be described. FIG. 2 is a cross-sectional view showing an exemplary configuration of the non-volatile memory device according to the embodiment of the present disclosure. Although the non-volatile memory device includes a plurality of variable resistance elements, one variable resistance element 1 and constituents connected to the variable resistance element 1 are shown in FIG. 2 for simplified illustration. Also, for easier understanding, a portion is enlarged.

The example of the non-volatile memory device 100 including the variable resistance element 1 as described above will be described. As shown in FIG. 2, the non-volatile memory device 100 includes a substrate 101, a transistor 200 formed on the substrate 101, a first wire 110 electrically connected to a drain layer 102 of the transistor 200 via a first contact plug 106, a second wire 111 placed in parallel with the first wire 110 and electrically connected to a source layer 103 of the transistor 200 via a second contact plug 107, the variable resistance element 1 having the above configuration, the first electrode 2 of which is electrically connected to the second wire 111 via a third contact plug 114, and a third wire 116 which is placed such that the third wire 116 three-dimensionally crosses the first wire 110 and the second wire 111 and is electrically connected to the second electrode 4 of the variable resistance element 1.

In the present embodiment, a fourth wire (gate layer 104) is formed as a word line, the third wire 116 is formed as a bit line, and the first wire 110 is formed as a plate line, thereby implementing a wire configuration (1T1R structure) of one-transistor-one memory cell (variable resistance element). Although not shown, the word line is connected to a row select circuit/driver, while the bit line is connected to a column select circuit/driver. The plate line is connected to a predetermined reference voltage source. The second wire 111 is formed as a leading wire connecting the second contact plug 107 and the third contact plug 114 to each other. In other words, the second wire 111 is not connected to any element in a planar direction of the substrate 101. Therefore, a contact plug connecting the second contact plug 107 to the third contact plug 114 may be formed in place of the second wire 111. However, by forming the second wire 11 rather than the contact plug, the second wire 111 can be formed in the same semiconductor process step as that of the first wire 110 as will be described below. Therefore, manufacturing process steps can be simplified, and controllability in the semiconductor process steps can be enhanced.

The configuration of the non-volatile memory device 100 as described above will be described in greater detail. In the present embodiment, the substrate 101 is a silicon substrate. The drain layer 102 and the source layer 103 are formed on the silicon substrate 101. A gate insulating layer is formed between the gate layer 104 and the substrate 101.

In a case where the drain layer 102 and the source layer 103 constitute, for example, a N-type transistor, they are formed by implanting n-type impurities such as phosphorous (P) and arsenic (As) into the substrate 101. In a case where the drain layer 102 and the source layer 103 constitute, for example, a P-type transistor, they are formed by implanting p-type impurities such as boron (B) and indium (In) into the substrate 101.

The first contact plug 106 and the second contact plug 107 are filled into contact holes formed in the first interlayer insulating layer 105 stacked on the substrate 101 provided with the transistor 200 such that the first interlayer insulating layer 105 covers the transistor 200. In the present embodiment, each of the first contact plug 106 and the second contact plug 107 includes a contact adhesion layer which is in contact with the first interlayer insulating layer 105 and a contact metal formed inward relative to the contact adhesion layer. In the present embodiment, the contact adhesion layer comprises a material containing as major components titanium (Ti) and a titanium nitride (TiN), while the contact metal comprises a material containing tungsten (W), as a major component.

The first wire 110 is formed within a wire channel formed on the first contact plug 106, by etching using the resist mask a first etching stopper layer 108 and a second interlayer insulating layer 109 which are stacked on the first interlayer insulating layer 105. The second wire 111 is formed within a wire channel formed on the second contact plug 107, by etching using the resist mask the first etching stopper layer 108 and the second interlayer insulating layer 109 which are stacked on the first interlayer insulating layer 105. Each of the wires 110, 111 includes a wire adhesion layer which is in contact with the second interlayer insulating layer 109 and a wire metal formed inward relative to the wire adhesion layer. The wire adhesion layer comprises, for example, a material such as tantalum (Ta), tantalum nitride (TaN), titanium (Ti), titanium nitride (TiN) or ruthenium (Ru). The wire metal comprises a material containing, for example, copper (Cu) as a major component.

The third contact plug 114 is filled into a contact hole formed in a second etching stopper layer 112 and a third interlayer insulating layer 113 which are stacked on the first wire 110, the second wire 111 and the second interlayer insulating layer 109 such that the contact hole 114 penetrates the second etching stopper layer 112 and the third interlayer insulating layer 113 to the second wire 111. The third contact plug 114 has the same configuration as that of the first contact plug 106 and the second contact plug 107.

The variable resistance element 1 is formed on the third interlayer insulating layer 113 and the third contact plug 114. Specifically, the first electrode 2 of the variable resistance element 1 is formed on the third contact plug 114 and connected to the third contact plug 114. A fourth interlayer insulating layer 115 is stacked on the third interlayer insulating layer 113 and around the variable resistance element 1. The third wire 116 is formed on the fourth interlayer insulating layer 115 such that the third wire 116 is filled into a wire channel formed on the second electrode 4 of the variable resistance element 1, by etching using the resist mask. The third wire 116 has the same configuration as that of the first wire 110 and the second wire 111. In the present embodiment, each of the first to fourth interlayer insulating layers 105, 109, 113, 115 comprises a silicon oxide.

A passivation layer 117 is formed on the fourth interlayer insulating layer 115 and the third wire 116 to protect their surfaces.

Although in the above exemplary configuration, the plate lines are placed in parallel with the word lines, they may be placed in parallel with the bit lines, respectively. Although the plate lines are configured to apply an equal electric potential to the transistors 200, the non-volatile memory device may include a plate line select circuit/driver having a configuration similar to that of the row select circuit/driver, and the plate line select circuit/driver may be configured to drive a selected plate line and an unselected plate line, with different voltages (including different polarities).

Hereinafter, an exemplary manufacturing method of the variable resistance element 1 in the non-volatile memory device as described above will be described.

FIGS. 3A and 3B, FIGS. 4A and 4B, FIGS. 5A and 5B, and FIGS. 6A and 6B are views for explaining an exemplary manufacturing method of the variable resistance element in the non-volatile memory device according to the embodiment. FIG. 3A, FIG. 4A, FIG. 5A, and FIG. 6A are perspective views showing the corresponding steps, respectively. FIG. 3B, FIG. 4B, FIG. 5B and FIG. 6B are cross-sectional views taken along X-X' and cross-sectional views taken along Y-Y', in the corresponding steps. Although these drawings show a case where four variable resistance elements 1 are formed for simplified illustration, the number of the variable resistance elements 1 to be formed is not limited to this. Also, for easier understanding, a portion of the constituents are shown in an enlarged manner. A base layer (the above stated third interlayer insulating layer 113) on which the variable resistance element 1 is formed is not shown in these drawings.

Figure 3A:
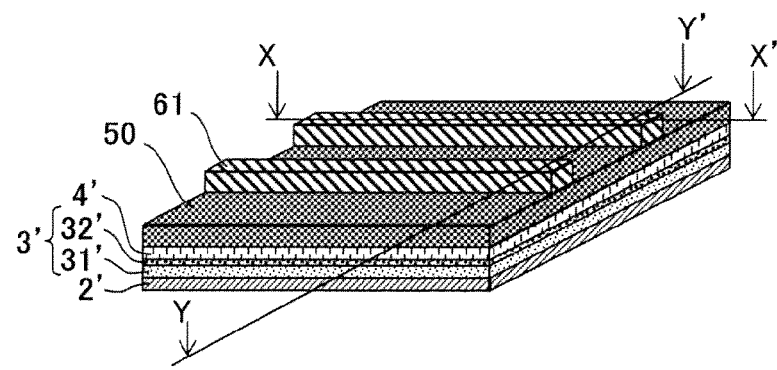
FIG. 3A is a perspective view for explaining an exemplary manufacturing method of the variable resistance element in the non-volatile memory device according to the embodiment.
Figure 3B:
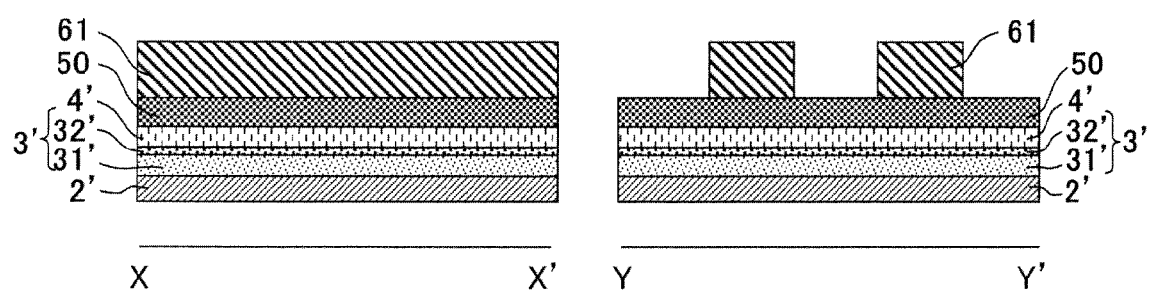
FIG. 3B is a cross-sectional view taken along X-X' of FIG. 3A and a cross-sectional view taken along Y-Y' of FIG. 3A.

Initially, in the steps of FIGS. 3A and 3B, a first electrode layer 2', a variable resistance material layer 3', a second electrode layer 4' and a hard mask layer 50 are formed in this order on the base layer (the above stated third interlayer insulating layer 113) such that the first electrode layer 2', the variable resistance material layer 3', the second electrode layer 4' and the hard mask layer 50 cover an exposed upper surface of the contact plug (the above stated third contact plug 114) formed in the layer underlying the variable resistance element 1.

For example, as the first electrode layer 2' before being patterned as the first electrode 2, a tantalum nitride (TaN) is formed to have a thickness of, for example, 20 nm on the base layer. Then, the variable resistance material layer 3' including a first variable resistance material layer 31' and a second variable resistance material layer 32' before being patterned is formed on the second electrode layer 2'. For example, the first variable resistance material layer 31' comprising the first tantalum oxide TaO, (in the present embodiment, x=1.56) is formed to have a thickness of, for example, 15 nm, while the second variable resistance material layer 32' comprising the second tantalum oxide $TaO_y$, (in the present embodiment, y=2.48) which is lower in degree of oxygen deficiency than the first variable resistance material layer 31' is formed to have a thickness of, for example, 5 nm, on the first variable resistance material layer 31'.

In the present embodiment, the first variable resistance material layer 31' before being patterned is deposited by reactive sputtering in which sputtering is conducted in an argon atmosphere containing oxygen using a tantalum target. Oxygen content atomic percentage of the first variable resistance material layer 31' can be easily adjusted by changing a flow ratio of an oxygen gas with respect to an argon gas during reactive sputtering. For example, by controlling an oxygen concentration in the first variable resistance material layer 31' so that it reaches 45 to 65 atm %, resistivity of the first variable resistance material layer 31' can be controlled to have a value of 0.5 to 20 m $\Omega$·cm. For example, when the oxygen concentration in the first variable resistance material layer 31' is 60 atm %, the resistivity of the first variable resistance material layer 31' is about 2 m $\Omega$·cm.

Then, an upper surface of the first variable resistance material layer 31' is oxidated (oxidized) by plasma oxidation in an oxygen atmosphere to form the second variable resistance material layer 32' in an upper portion of the first variable resistance material layer 31'. For example, the first tantalum oxide $TaO_x$, constituting the first variable resistance material layer 31' is deposited to have a thickness of 20 nm, and then the upper surface of the deposited TaO, is oxidated by plasma oxidation in the oxygen atmosphere to form the second variable resistance material layer 32' comprising the second tantalum oxide $TaO_y$, in a region which is, for example, 5 nm from the upper surface of the deposited first tantalum oxide $TaO_x$. A thickness of the second variable resistance material layer 32' can be easily adjusted by adjusting time (exposure time) for which the first tantalum oxide $TaO_x$ is exposed to plasma.

The oxidation method is not limited to the plasma oxidation. For example, thermal process in the oxygen atmosphere, or the like, which effectively oxidates (oxidizes) the upper surface of the first tantalum oxide $TaO_x$ may be used. Instead of oxidating (oxidizing) the upper surface of the first tantalum oxide $TaO_x$, the second tantalum oxide $TaO_y$ may be deposited to have a thickness of, for example, 5 nm by reactive sputtering, after the first tantalum oxide TaO, is deposited to have a thickness of, for example, 15 nm. In the reactive sputtering, the oxygen content in the deposited layer can be adjusted by changing the oxygen concentration in a sputtering atmosphere, or by using a metal oxide target as a target. In a case where the second tantalum oxide $TaO_y$ is formed, the second tantalum oxide $TaO_y$ may be produced during sputtering conducted using metal tantalum as a target, or a tantalum oxide target (e.g., $Ta_2O_5$) may be used.

In a case where a hafnium oxide is used as the material of the variable resistance material layer 3', the variable resistance material layer 3' can be formed as in the case of using the tantalum oxide. In this case, the thickness of second variable resistance material layer 32' may be set to 3 to 4 nm. Also, in a case where a zirconium oxide is used as the material of the variable resistance material layer 3', the variable resistance material layer 3' can be formed as in the case of using the tantalum oxide. In this case, the thickness of second variable resistance material layer 32' may be set to 1 to 5 nm.

Further, as the second electrode layer 4' before being patterned as the second electrode 4, for example, iridium (Ir) may be formed to have a thickness of, for example, 30 nm, on the second variable resistance material layer 32'. Then, as the hard mask layer 50, titanium aluminum nitride (TiAlN) is formed to have a thickness of, for example, 50 nm, on the upper surface of the second electrode layer 4'. It should be noted that as the hard mask layer 50, a material which is lower in etching rate than the material constituting the second electrode layer 4' is selected. For example, as the hard mask layer 50, aluminum oxide ($Al_2O_3$) may be used instead of titanium aluminum nitride.

Then, a first resist mask 61 (e.g., thickness: 420 nm) extending in the first direction (X-direction) is formed on the hard mask layer 50. Although not shown, a reflection preventing layer (e.g., thickness: 80 nm) may be formed on the hard mask layer 50 before forming the first resist mask 61. The first resist mask 61 is patterned in a line shape having a line width which is, for example, 190 nm or less (e.g., about 140 nm) by the existing exposure process and development process.

Figure 4A:
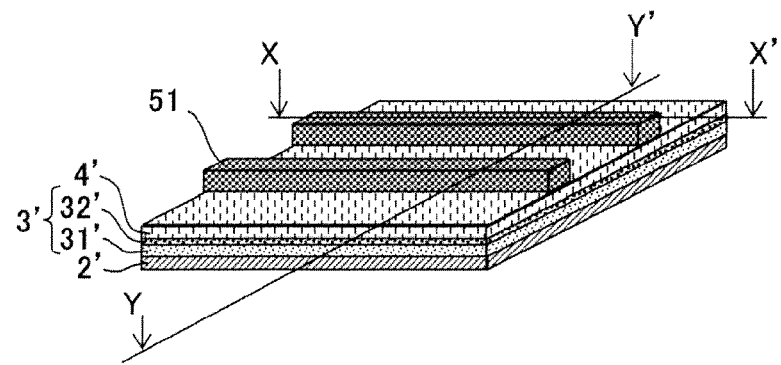
FIG. 4A is a perspective view for explaining an exemplary manufacturing method of the variable resistance element in the non-volatile memory device according to the embodiment.
Figure 4B:
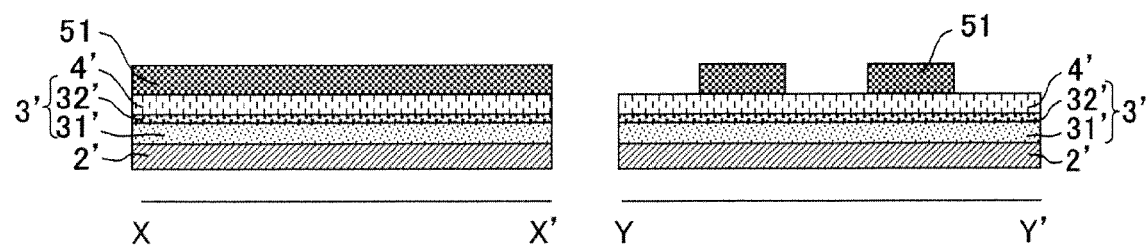
FIG. 4B is a cross-sectional view taken along X-X' of FIG. 4A and a cross-sectional view taken along Y-Y' of FIG. 4A.

Then, in the step of FIGS. 4A and 4B, using the first resist mask pattern 61 as a mask, the hard mask layer 50 is etched such that the variable resistance material layer 3' is not exposed (the second electrode layer 4' is left), thereby forming the first hard mask 51. If the reflection preventing layer is formed, it is also etched. As the etching for forming the first hard mask 51, a dry-etching process is used. As an etching gas used in this dry-etching process, a mixture gas containing chlorine may be used. For example, in a case where the second electrode layer 4' comprises iridium, iridium chloride which is a substance produced by non-volatile etching, is produced, if the hard mask layer 50 is etched in the mixture gas containing chlorine. This makes it possible to ensure a great etching selectivity between the second electrode layer 4' and the hard mask layer 50, which can reduce a possibility that the second electrode layer 4' is etched and thereby non-uniformity of dimensions occurs.

Thereafter, the first resist mask pattern 61 and the reflection preventing layer are removed by ashing, thereby forming the stacked-layer structure of FIGS. 4A and 4B. The ashing may be performed under the mixture gas containing oxygen.

In the present embodiment, as shown in FIGS. 4A and 4B, the second electrode layer 4' is exposed in a region other than the first hard mask 51 when viewed from above in a state where the first hard mask 51 is formed. This can reduce a possibility that the variable resistance material layer 3' is exposed to the etching gas, and hence lessen non-uniformity of characteristics of the variable resistance elements 1. In a case where the passivation layer or the like is provided on the second electrode layer 4', etching may be carried out such that the passivation layer or the like is left (exposed).

Figure 5A:
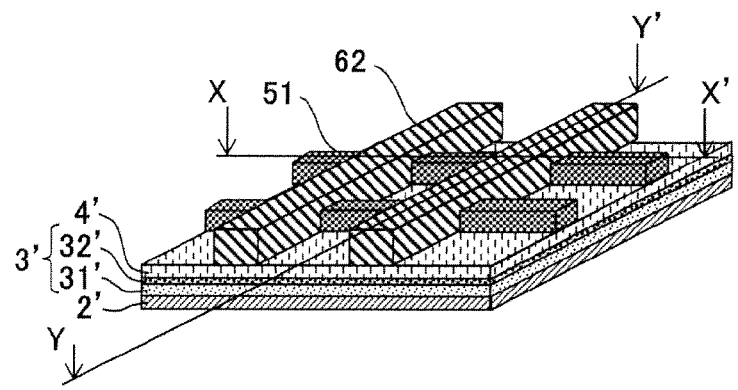
FIG. 5A is a perspective view for explaining an exemplary manufacturing method of the variable resistance element in the non-volatile memory device according to the embodiment.
Figure 5B:
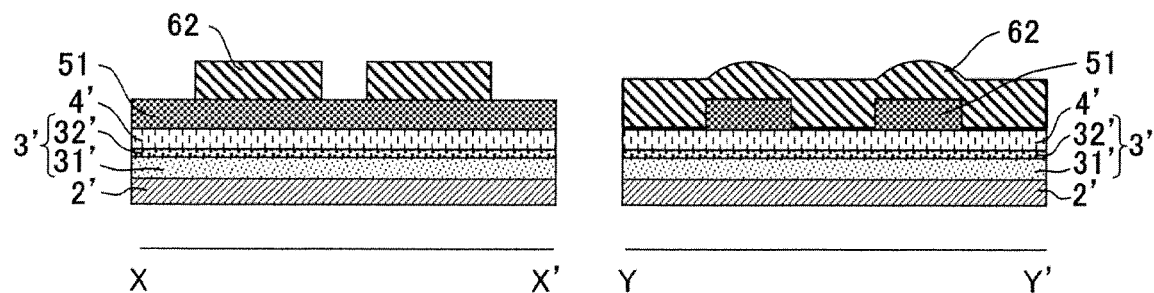
FIG. 5B is a cross-sectional view taken along X-X' of FIG. 5A and a cross-sectional view taken along Y-Y' of FIG. 5A.

Then, in the step of FIGS. 5A and 5B, a second resist mask 62 (e.g., thickness: 420 nm) is formed on the second electrode layer 4' and the first hard mask 51 such that the second resist mask 62 extends in a second direction (Y) and crosses the first hard mask 51. Although not shown, a reflection preventing layer (e.g., thickness: 80 nm) may be formed on the second electrode layer 4' and the first hard mask 51 before forming the second resist mask 62. In this case, as shown in FIG. 5B, because of the presence of the first hard mask 51, the second resist mask 62 (and reflection preventing layer) has a cross-sectional shape taken along Y-Y', in which a region in the vicinity of the first hard mask 51 swells to be higher than the other region (in FIG. 5A, this swelling region is not shown).

It should be noted that the width of the second resist mask 62 is set greater than the width of the first resist mask 61. The second resist mask 62 is patterned in line shape having a line width which is, for example, 190 nm or less (e.g., 110 nm or more when the line width of the first resist mask 61 is 100 nm) by the existing exposure process and development process.

As described above, it is required that the height of the second hard mask 52 fall within the range of the focus margin, and the range of the focus margin decreases as the width of the second resist mask 62 decreases. Because of this, in a case where the width of the second resist mask 62 is small, then the height of the second hard mask 52 is allowed to fall within the range of the focus margin, by reducing the height of the first hard mask 51 in correspondence with the smaller width of the second resist mask 62. For example, when the height of the second hard mask 52 (thickness of the first hard mask 51 of FIG. 4A or FIG. 4B) is h, and the width of the second resist mask 62 (length of the second resist mask 62 in X-X' direction in the X-X' cross-sectional shape of FIG. 5B) is d2, $d2/h>1$ may be satisfied. This makes it possible to effectively suppress the pattern stripping of the second resist mask 62. In a case where the height of the first hard mask 51 is determined as described above in the relationship with the width of the second resist mask 62, the height of the hard mask layer 50 is set so that this height is attained in a state in which the second hard mask 52 is formed.

Figure 6A:
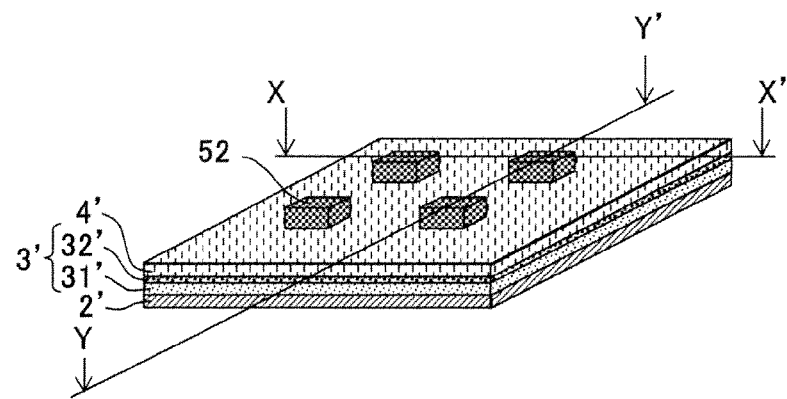
FIG. 6A is a perspective view for explaining an exemplary manufacturing method of the variable resistance element in the non-volatile memory device according to the embodiment.
Figure 6B:
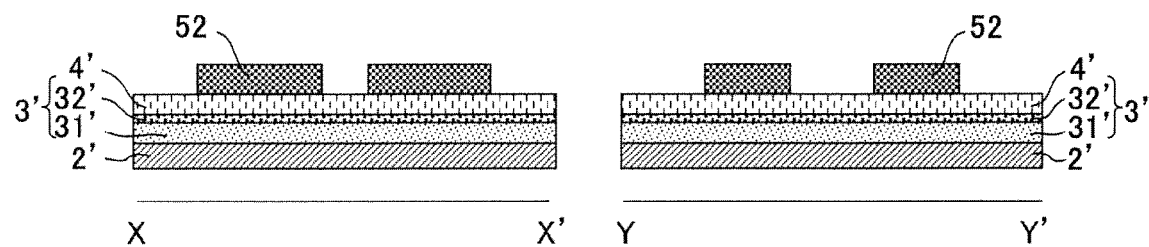
FIG. 6B is a cross-sectional view taken along X-X' of FIG. 6A and a cross-sectional view taken along Y-Y' of FIG. 6A.

Then, in the step of FIGS. 6A and 6B, the first hard mask 51 is etched using the second resist mask 62 as the mask, to form the second hard mask 52. By etching the hard mask layer 50 using the first and second resist masks 61, 62 which cross each other as described above, the second hard mask 52 is formed to have an island shape (square shape). As the etching for forming the second hard mask 52, the dry-etching process is used. Thereafter, the second resist mask 62 is removed by ashing, thereby forming the stacked-layer structure of FIGS. 6A and 6B.

Then, by using the formed second hard mask 52 as the mask, the second electrode layer 4', the variable resistance material layer 3', and the first electrode layer 2' are etched (dry-etched), to form by patterning, the variable resistance element 1 including the second electrode 4, the variable resistance layer 3 and the first electrode 2, as shown in FIGS. 1A and 1B. After that, the second hard mask 52 is removed. The second hard mask 52 may be removed by, for example over-etching or wet-etching.

In a case where the second hard mask 52 is an electric conductor, it may be left without removing it. In this case, the second electrode 4 of the variable resistance element 1 and the upper wire (above described third wire 116) may be connected to each other via the second hard mask 52.

As a result of the above steps, the variable resistance element 1 having a miniaturized structure is formed, which has a rectangular shape when viewed from above (when viewed from a substrate upper surface), in which the width in the first direction and the width in the second direction are 190 nm or less (e.g., 170 nm), and non-uniformity of characteristics is lessened. The term "rectangular shape" refers to a shape including a pair of first linear portions extending along the first direction such that they are opposite to each other and a pair of second linear portions extending along the second direction crossing the first direction such that they are opposite to each other, when viewed from above, as will be described later. In other words, the rectangular shape includes shapes having four linear portions. For example, the rectangular shape includes, a square shape, an oblong shape, a lozenge shape, a trapezoidal shape, a parallelogram shape, shapes having curves in portions of the square shape, the oblong shape, the lozenge shape, the trapezoidal shape, the parallelogram shape (e.g., shape having rounded corners in the square shape, and the like), etc.

In accordance with the above described manufacturing method, the hard mask layer 50 and the first resist mask 61 extending in the first direction are formed on the stacked-layer structure including the first electrode layer 2', the variable resistance material layer 3', and the second electrode layer 4' such that they are stacked together, and then the hard mask layer 50 is etched using the first resist mask 61, to form the first hard mask 51 extending in the first direction. Then, the second resist mask 62 extending in the second direction crossing the first direction is formed on the first hard mask 51, and the first hard mask 51 is etched using the second resist mask 62, to form the second hard mask 52 having the specified width in the first direction and the specified width in the second direction. The above stated stacked-layer structure is etched using the second hard mask 52, thereby forming the variable resistance element 1.

In the above described manner, the width of the second hard mask 52 in the first direction and the width of the second hard mask 52 in the second direction crossing the first direction are defined by the width of the first resist mask 61 and the width of the second resist mask 62, respectively. This means that the length of the first resist mask 61 and the length of the second resist mask 62 do not affect the miniaturization of the second hard mask 52. Therefore, even when the width of the first resist mask 61 and the width of the second resist mask 62 are set smaller, it is possible to ensure a sufficient area (application area of resist mask) of the hard mask and the resist mask which adhere to each other. This makes it possible to implement miniaturization while suppressing the stripping of the mask pattern.

By setting the width of the second resist mask 62 greater than the width of the first resist mask 61, the focus margin can be set greater than that in the case of forming the first resist mask 61 and non-uniformity of dimensions can be suppressed, when the second resist mask 62 is formed on the layer which has a level difference due to the first resist mask 61 of line shape. By comparison, the first resist mask 61 can be formed properly on the layer with no level difference even when the focus margin is set smaller. Therefore, a miniaturized structure can be implemented. As a result, it becomes possible to easily suppress non-uniformity of dimensions of the variable resistance elements while easily providing a miniaturized structure.

Furthermore, since the variable resistance element 1 with non-uniformity of characteristics lessened can be manufactured using the existing semiconductor process steps without specially dedicated semiconductor process steps, the manufacturing method which is easily applicable to (i.e., highly compatible with) the semiconductor process steps which are developed to provide a further miniaturized structure, can be implemented.

Moreover, since the second hard mask 52 having the specified width in the first direction and the specified length in the second direction crossing the first direction is formed and then etching is performed using the second hard mask 52 to form the variable resistance element 1, it becomes possible to reduce the number of times at least the side surfaces of the variable resistance layer 3 formed by patterning are exposed to the etching plasma and the etching gas and time for which the side surfaces of the variable resistance layer 3 are exposed to the etching plasma and the etching gas, as compared to the conventional manufacturing method using double patterning. Therefore, etching damages to the variable resistance layer 3 can be lessened, and non-uniformity of characteristics of the variable resistance element 1 can be reduced.

Furthermore, as described above, since the variable resistance element 1 with non-uniformity of characteristics lessened can be manufactured using the existing semiconductor process steps without specially dedicated semiconductor process steps, the manufacturing method which is easily applicable to (i.e., highly compatible with) the semiconductor process steps which are developed to provide a further miniaturized structure, can be implemented.

In the present embodiment, in the step of forming the variable resistance element 1 by etching using the second hard mask 52 as the mask, the second electrode layer 4' is etched using a mixture gas containing chlorine and oxygen as the etching gas, while the variable resistance material layer 3' and the first electrode layer 2' are etched using a mixture gas containing sulfur as the etching gas.

Also, in this step, the second electrode 4, the variable resistance layer 3 and the first electrode 2 are formed by a dry-etching process performed once by changing the etching gas as described above.

In the conventional manufacturing method using the double patterning, the lower wire and the memory cell layer (corresponding to the second electrode layer 4', the variable resistance material layer 3', and the first electrode layer 2' in the present embodiment) are etched in line shape, then the mask (e.g., upper wire) extending to cross the direction of the formed line is formed, and then the lower wire and the memory cell layer are re-etched using this mask. For this reason, the side surfaces of the memory cell layer etched by the first etching are exposed to the etching gas in the second etching. Therefore, etching damages are increased.

In contrast, in the present embodiment, the second electrode layer 4', the variable resistance material layer 3', and the first electrode layer 2' are etched together. Especially, since the side surfaces of the variable resistance layer 3 are formed together, it becomes possible to reduce the number of times at least the side surfaces of the variable resistance layer 3 are exposed to the etching gas and time for which the side surfaces of the variable resistance layer 3 are exposed to the etching gas. This can lessen etching damages to the variable resistance layer 3, and hence lessen non-uniformity of characteristics of the variable resistance element 1. The phrase "the side surfaces of the variable resistance layer 3 are formed together" means that the entire side surfaces of the variable resistance layer 3 are formed together in the same process step.

Alternatively, the second electrode layer 4', the variable resistance material layer 3', and the first electrode layer 2' may be etched using a gas which can suppress the etching damages. Specifically, in a case where the variable resistance material layer 3' comprises a metal oxide which increases its resistance value as its oxygen content increases, a gas (e.g., oxygen gas which promotes oxidation, hydrogen bromide (HBr) gas or methane trifluoride ($CHF_3$) gas, which is capable of protecting the side walls, etc.) which is capable of suppressing deficiency of oxygen in an etching end surface, is used as the etching gas. Thus, it becomes possible to suppress desorption of oxygen or entry of impurities such as fluorine to the variable resistance material layer 3', due to the fact that the exposed etching end surface of the variable resistance material layer 3' in the dry-etching process, contacts the etching gas. Therefore, the etching damages to the variable resistance layer 3 can be lessened.

The second electrode layer 4' and the first electrode layer 2' may also be etched using the gas which is capable of suppressing deficiency of oxygen. In the dry-etching process for forming the second electrode 4 by patterning from the second electrode layer 4', the etching damages to the variable resistance material layer 3' (especially second variable resistance material layer 32') which is exposed during over-etching of the second electrode layer 4' can be suppressed more surely.

In the dry-etching process for forming the first electrode 2 by patterning from the first electrode layer 2', when the first electrode layer 2' is etched, the variable resistance layer 3 overlying the first electrode layer 2' has been already formed by patterning. Therefore, the side surfaces of the variable resistance layer 3 are exposed to the etching plasma. In light of this, by using the gas which is capable of suppressing deficiency of oxygen as the etching gas, the side surfaces of the variable resistance layer 3 are less susceptible to the etching damages even during the dry-etching of the second electrode layer 2.

The hard mask layer 50 may comprise an insulator material. This can surely reduce a possibility that charges from the etching plasma are applied to the variable resistance element 1 in the step of forming the variable resistance element 1 by etching. Thus, etching damages (charge damages) can be suppressed.

Figure 7:
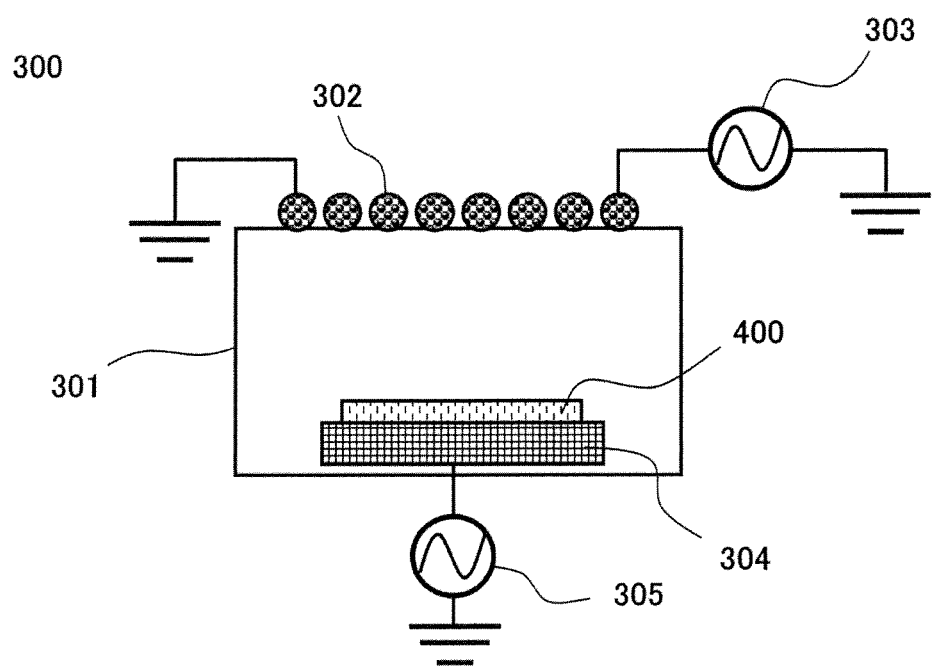
FIG. 7 is a schematic view showing a structure of a dry-etching apparatus used in a dry-etching process in a case where the variable resistance element is manufactured in the embodiment.

Hereinafter, the dry-etching process in the present embodiment will be described more specifically. FIG. 7 is a schematic view showing a structure of a dry-etching apparatus used in the dry-etching process in a case where the variable resistance element is manufactured in the present embodiment. As shown in FIG. 7, a dry-etching apparatus 300 used in the present embodiment includes an etching chamber 301, an antenna coil 302, a source-side RF electric power supply 303 for supplying electric power to the antenna coil 302, an electrode 304 which is placed within the etching chamber 301 and serves as a table on which a wafer 400 which is an etching target is placed, and a bias-side RF electric power supply 305 for supplying electric power to the electrode 304. In addition to these, although not shown, the dry-etching apparatus 300 includes an etching gas inlet, an exhaust system for adjusting a gas pressure within the etching chamber, etc.

When the upper surface of the wafer 400 is dry-etched in the dry-etching apparatus 300 configured as described above, the wafer 400 is mounted onto the electrode 304. In this state, the etching gas is introduced and a gas pressure is adjusted. Then, the electric power is supplied from the source-side RF electric power supply 303 to the antenna coil 302. This causes the etching plasma to be generated within the etching chamber 301. After that, the electric power is supplied from the bias-side RF electric power supply 305 to the electrode 304. This causes an activated gas (etching gas) in the etching plasma to enter the upper surface of the wafer 400 in a direction perpendicular to the upper surface of the wafer 400, which allows the wafer 400 to be etched.

In the present embodiment, intensity of the etching performed by the dry-etching apparatus 300 is adjusted by changing the electric power (this will be referred to as etching electric power) supplied from the bias-side RF electric power supply 305 to the electrode 304 under a state in which the electric power supplied from the source-side RF electric power supply 303 is constant in magnitude.

Figure 8:
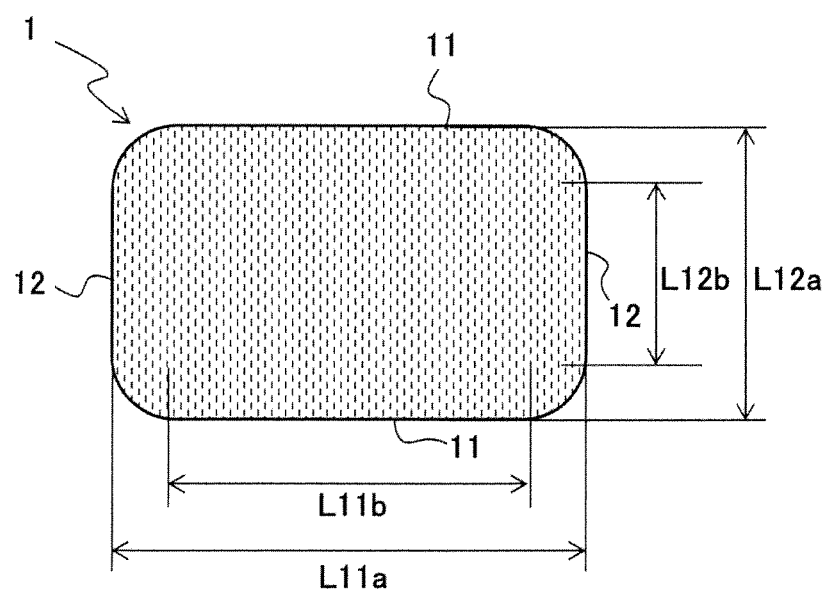
FIG. 8 is a plan view showing the variable resistance element formed by the manufacturing method of the non-volatile memory device according to the embodiment.

Next, the shape and size of the variable resistance element 1 formed by the above described manufacturing method will be described. FIG. 8 is a plan view showing the variable resistance element formed by the manufacturing method of the non-volatile memory device according to the present embodiment. As shown in FIG. 8, the variable resistance element 1 formed by the above described manufacturing method has a shape including a pair of first linear portions 11 extending along the first direction (X-direction) such that they are opposite to each other and a pair of second linear portions 12 extending along the second direction (Y-direction) crossing the first direction such that they are opposite to each other, when viewed from above. One of a distance between the pair of first linear portions 11 and a distance between the pair of second linear portions 12, which is smaller (short-side width) between these two, is, for example, 400 nm or less. For example, the widths L11a, L12a of the variable resistance element 1, are 190 nm or less, when viewed above.

In the present embodiment, as described above, the distance L11a between the pair of second linear portions 12 is set greater than the distance L12a between the pair of first linear portions 11. For example, the width L11a of the variable resistance element 1 including the first linear portions 11 is 100 nm, while the width L12a of the variable resistance element 1 including the second linear portions 12 is 160 nm. The first linear portion 11 and the second linear portion 12 which are adjacent to each other are connected to each other by a rounded corner portion. The first linear portion 11 and the second linear portion 12 refer to regions where the end portion of the variable resistance element 1 are linear in average and may include roughness which is permissible in the semiconductor process steps. For example, each of the first linear portion 11 and the second linear portion 12 may include a roughness which is equal to or less than 10% of its dimension. The distance between the pair of first linear portions 11 means a length of virtual line segments including the second linear portions 12, among the sides constituting a virtual rectangle formed by extending the first linear portion 11 and the second linear portion 12, while the distance between the pair of second linear portions 12 means a length of virtual line segments including the first linear portions 12, among the sides constituting the virtual rectangle.

Figure 9:
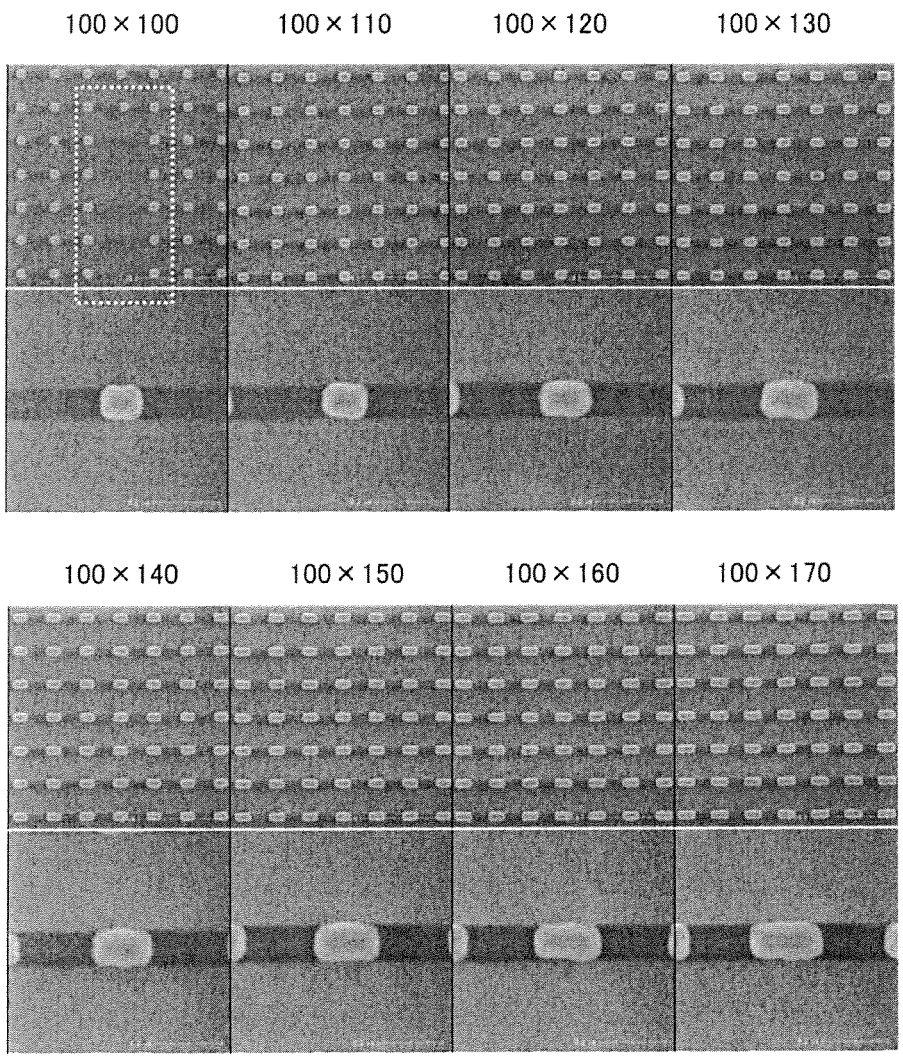
FIG. 9 is a view showing SEM images of the variable resistance elements formed by the manufacturing method of the non-volatile memory device according to the embodiment.

FIG. 9 is a view showing SEM images of the variable resistance elements formed by the manufacturing method of the non-volatile memory device according to the embodiment. FIG. 9 shows the SEM images obtained after plural rows of variable resistance elements 1 are formed in the first direction and in the second direction under conditions in which the width of the first resist mask 61 is set to 100 nm, and the width of the second resist mask 62 is set to 100 nm, 110 nm, 120 nm, 130 nm, 140 nm, 150 nm, 160 nm, and 170 nm. The height of the first hard mask 51 is set to 100 nm. The element of 100 nm×100 nm is Reference example, and the other elements correspond to Example of the present embodiment. In each SEM Image, an upper image depicting the plurality of variable resistance elements, which are arranged, is the image which is magnified 50000 times, while a lower image in which one variable resistance element is focused is the image which is magnified 200000 times.

As shown in FIG. 9, by using the second hard mask 52 formed by etching using the first resist mask 61 and by etching using the second resist mask 62, the variable resistance element could be formed irrespective of whether its shape is square (Reference Example) or oblong (Example), even in the range of the element dimension of 190 nm or less, in which it was difficult to form the resist mask in the conventional manufacturing method.

However, regarding the variable resistance elements of square shape, as surrounded by a broken line in FIG. 9, it was observed that the variable resistance elements were not formed in a certain region, i.e., the pattern was lacking. It is estimated that this was due to, for example, a problem that the focus margin was not set greater when the second resist mask 62 was formed, and thereby the width of the second resist mask 62 became smaller than a designed width and was deformed. In addition, it is estimated that the fact that the ratio of the width of the second resist mask 62 with respect to the height of the first hard mask 51 was set to a value which was less than 1 might be one cause of the pattern stripping. In contrast, regarding the variable resistance elements of oblong shape, the plurality of variable resistance elements could be formed in a stable condition by setting the width of the second resist mask 62 greater than the width of the first resist mask 61. It is estimated that regarding the variable resistance elements of oblong shape, the fact that the ratio of the width of the second resist mask 62 with respect to the height of the first hard mask 51 was set to a value which was greater than 1 might be one case of efficiently suppressing the pattern stripping.

Figure 10:
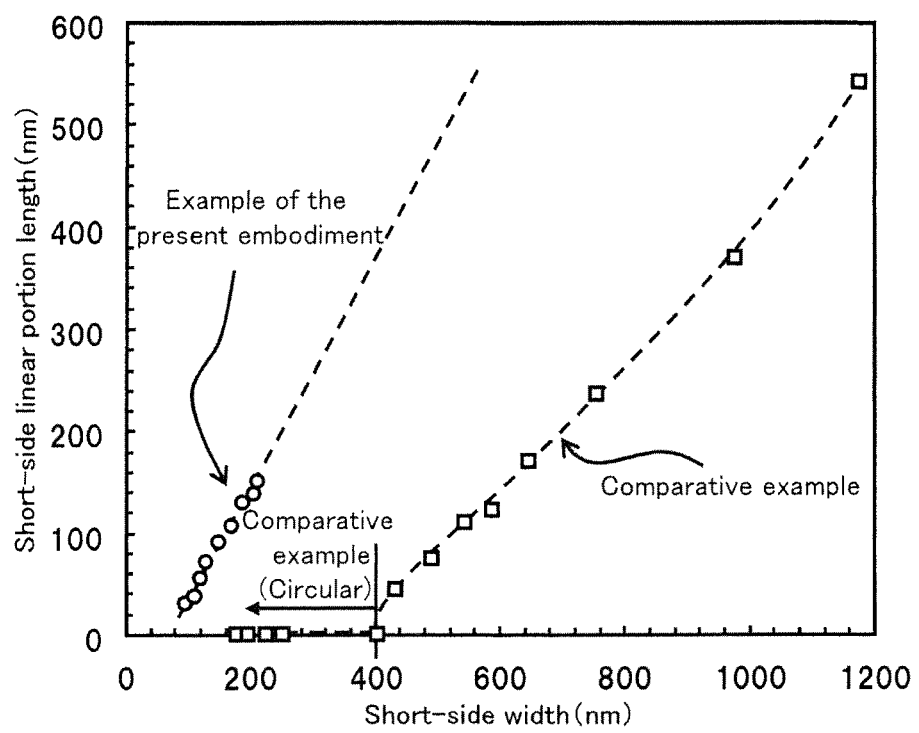
FIG. 10 is a graph showing a relationship between a length of a short-side linear portion and a short-side width of the variable resistance element formed by the manufacturing method according to the embodiment, along with Comparative example.

FIG. 10 is a graph showing a relationship between a length of a short-side linear portion and a short-side width of the variable resistance element formed by the manufacturing method according to the embodiment, along with Comparative example. As Comparative example, measurement was conducted for the variable resistance elements formed using the rectangular resist mask and the same exposure apparatus as the exposure apparatus (KrF stepper) used to form the variable resistance element 1 of the present embodiment, as in the case of the present embodiment.

In FIG. 10, round symbols indicate the relationship of the variable resistance elements 1 formed by the method of the present embodiment. FIG. 10 shows the relationship between the width (short-side width) L12a of the variable resistance element 1 and the length (short-side-width linear portion) L12b of the linear portion (second linear portion 12) existing within this width. Also, rectangular symbols indicate the relationship of the variable resistance elements in Comparative example.

In Comparative example using the rectangular resist mask, the length of the short-side-width linear portion is 0 when the short-side width is 400 nm or less. This indicates that the variable resistance element does not have the linear portion in its planar shape and has a circular shape. It is estimated that this is due to the fact that since an opening width of the resist mask is reduced, diffraction of light occurs, and thereby light emitted from the exposure apparatus travels to a back side of the resist mask at the corner portions of the rectangular resist mask.

In contrast, in the present embodiment, it can be seen that the variable resistance element 1 has the short-side linear portion length L11*b* even in the miniaturized region in which the short-side width L11*a* is 400 nm or less. In addition, it was revealed that even in the range in which the short-side width L11*a* is 400 nm or less, the ratio of the linear portion length L11*b* with respect to the short-side width L11*a* is not reduced significantly, and the variable resistance element 1 of rectangular shape which is close to oblong shape when viewed from above can be formed.

As should be understood from the above, the variable resistance element 1 formed by the above manufacturing method can be miniaturized while suppressing non-uniformity of characteristics. By fabricating the non-volatile memory device 100 including, for example, one transistor-one variable resistance element (1T1R), etc., shown in FIG. 2, by using the variable resistance element 1, it becomes possible to implement the non-volatile memory device 100 which is able to operate at a high speed and stably and has a miniaturized structure and a high capacity.

Thus far, the embodiment of the present disclosure has been described. The present disclosure is not limited to the above embodiment and the embodiment can be improved, changed or modified in various ways without departing from a spirit of the disclosure.

For example, although in the above embodiment, the non-volatile memory device 100 having the 1T1R structure of FIG. 2 has been described, the present disclosure is not limited to this so long as the non-volatile memory device 100 includes the variable resistance element 1 as described in the above embodiment. For example, the variable resistance element 1 described in the above described embodiment is applicable to a cross-point non-volatile memory device in which a current steering element is connected in series with the variable resistance element 1 (having 1D1R structure).

The magnitude of the etching electric power used for forming the first hard mask 51 may be equal to or different from that of the etching electric power used for forming the second hard mask 52. Especially, by setting the etching electric power used for forming the second hard mask 52 smaller in magnitude than the etching electric power used for forming the first hard mask 51, the charge damages to the variable resistance layer 3 can be suppressed when the second had mask 52 is formed by etching.

INDUSTRIAL APPLICABILITY

A manufacturing method of a non-volatile memory device of the present disclosure is useful as a manufacturing method of a non-volatile memory device which can be incorporated into a variety of electronic devices such as digital home appliances, memory cards, portable phones, and personal computers.

REFERENCE SIGNS LIST

1 variable resistance element
2 first electrode
2' first electrode layer
3 variable resistance layer
3' variable resistance material layer
4 second electrode
4' second electrode layer
11 first linear portion
12 second linear portion
31 first variable resistance layer
31' first variable resistance material layer
32 second variable resistance layer
32' second variable resistance material layer
50 hard mask layer
51 first hard mask
52 second hard mask
61 first resist mask
62 second resist mask
100 non-volatile memory device
101 substrate
102 drain layer
103 source layer
104 gate layer
105 first interlayer insulating layer
106 first contact plug
107 second contact plug
108 first etching stopper layer
109 second interlayer insulating layer
110 first wire
111 second wire
112 second etching stopper layer
113 third interlayer insulating layer
114 third contact plug
115 fourth interlayer insulating layer
116 third wire
117 passivation layer
200 transistor
300 dry-etching apparatus
301 etching chamber
302 antenna coil
303 source-side RF electric power supply
304 electrode
305 bias-side RF electric power supply
400 wafer

What is claimed is:

1. A method of manufacturing a non-volatile memory device comprising steps of:
   forming a first electrode layer;
   forming a variable resistance material layer comprising an oxygen-deficient metal oxide on the first electrode layer;
   forming a second electrode layer on the variable resistance material layer;
   forming a first layer on the second electrode layer;
   forming, by a first lithography process, a first resist mask extending in a first direction on the first layer;
   forming a first pattern extending in the first direction by etching the first layer using the first resist mask;
   forming, by a second lithography process, a second resist mask extending in a second direction crossing the first direction, on the first pattern;
   forming a hard mask by etching the first pattern using the second resist mask; and
   forming a variable resistance element by etching the second electrode layer, the variable resistance material layer and the first electrode layer using the hard mask such that the variable resistance element includes a second electrode, a variable resistance layer and a first electrode;
   wherein a width of the second resist mask is greater than a width of the first resist mask to set a focus margin in the second lithography process greater than a focus margin in the first lithography process.

2. The method of manufacturing the non-volatile memory device according to claim 1, wherein the width of the first resist mask and the width of the second resist mask are 190 nm or less.

3. The method of manufacturing the non-volatile memory device according to claim 1, wherein the variable resistance element has a shape in which the variable resistance element includes a pair of first linear portions which are opposite to each other and a pair of second linear portions extending in a direction crossing the pair of first linear portions, when viewed from above.

4. The method of manufacturing the non-volatile memory device according to claim 1, wherein:
- in the step of forming the first pattern, the first layer is etched such that the variable resistance material layer is not exposed, and
- in the step of forming the hard mask, the first pattern is etched such that the variable resistance material layer is not exposed.

5. The method of manufacturing the non-volatile memory device according to claim 1, wherein in the step of forming the variable resistance element, at least side surfaces of the variable resistance layer are formed together.

6. The method of manufacturing the non-volatile memory device according to claim 1, wherein the second electrode layer comprises a precious metal.

7. The method of manufacturing the non-volatile memory device according to claim 1, wherein when viewed from above after the step of forming the hard mask and before the step of forming the variable resistance element, the second electrode layer is exposed in a region other than the hard mask.

8. The method of manufacturing the non-volatile memory device according to claim 1, wherein the variable resistance material layer comprises a transition metal oxide or an aluminum oxide.

9. The method of manufacturing the non-volatile memory device according to claim 1, wherein the variable resistance material layer includes one selected from the group consisting of a tantalum oxide, a hafnium oxide and a zirconium oxide.

10. The method of manufacturing the non-volatile memory device according to claim 1, wherein a ratio of the width of the second resist mask with respect to a height of the first pattern is greater than 1.

11. The method of manufacturing the non-volatile memory device according to claim 1, wherein the first layer includes titanium aluminum nitride.

12. The method of manufacturing the non-volatile memory device according to claim 1, wherein the first layer includes an insulating material.

13. The method of manufacturing the non-volatile memory device according to claim 12, wherein the first layer includes aluminum oxide.

* * * * *